United States Patent
Oh et al.

(10) Patent No.: US 9,691,477 B2
(45) Date of Patent: Jun. 27, 2017

(54) RESISTIVE MEMORY SYSTEM AND METHOD OF OPERATING THE RESISTIVE MEMORY SYSTEM

(71) Applicant: SAMSUNG ELECTRONICS CO., LTD., Suwon-si, Gyeonggi-Do (KR)

(72) Inventors: Eun Chu Oh, Hwaseong-si (KR); Jun Jin Kong, Yongin-si (KR); Young Bae Kim, Seoul (KR); Hong Rak Son, Anyang-si (KR); Pil Sang Yoon, Hwaseong-si (KR); Han Shin Shin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/042,516

(22) Filed: Feb. 12, 2016

(65) Prior Publication Data

US 2016/0240252 A1 Aug. 18, 2016

(30) Foreign Application Priority Data

Feb. 17, 2015 (KR) .................. 10-2015-0024312

(51) Int. Cl.
*G11C 13/00* (2006.01)
*G11C 7/10* (2006.01)
*G11C 11/56* (2006.01)
*G11C 11/16* (2006.01)

(52) U.S. Cl.
CPC ........ *G11C 13/0069* (2013.01); *G11C 7/1006* (2013.01); *G11C 11/1675* (2013.01); *G11C 11/5607* (2013.01); *G11C 11/5678* (2013.01); *G11C 11/5685* (2013.01); *G11C 13/004* (2013.01); *G11C 13/0035* (2013.01); *G11C 13/0097* (2013.01); *G11C 2013/0076* (2013.01)

(58) Field of Classification Search
CPC .................................................. G11C 13/0069
USPC .................................................. 365/148, 227
See application file for complete search history.

(56) References Cited

U.S. PATENT DOCUMENTS

| | | | |
|---|---|---|---|
| 6,862,235 B2 | 3/2005 | Sakata et al. | |
| 7,800,935 B2 | 9/2010 | Maejima et al. | |
| 2008/0055984 A1* | 3/2008 | Nazarian | G11C 11/5628 365/185.03 |
| 2009/0080249 A1* | 3/2009 | Sprouse | G11C 11/5628 365/185.03 |

(Continued)

*Primary Examiner* — Hoai V Ho
*Assistant Examiner* — Jay Radke
(74) *Attorney, Agent, or Firm* — Volentine & Whitt, PLLC

(57) ABSTRACT

A resistive memory system having a plurality of memory cells includes a memory device having a resistive memory cell array and a controller. The controller generates write data to be written to the memory cell array by encoding input data such that the input data corresponds to an erase state and a plurality of programming states that a memory cell may have. The input data is encoded such that at least one of the number of memory cells assigned a first programming state and the number of memory cells assigned a second programming state is smaller than at least one of the numbers of memory cells in the erase state and the other programming states. The first programming state has a highest resistance level among the plurality of programming states, and the second programming state has a second highest resistance level among the plurality of programming states.

18 Claims, 18 Drawing Sheets

(56) References Cited

U.S. PATENT DOCUMENTS

| | | | |
|---|---|---|---|
| 2009/0185417 A1* | 7/2009 | Cho | G11C 11/5628 365/185.03 |
| 2009/0281293 A1* | 11/2009 | Xu | C07D 417/04 536/7.4 |
| 2009/0303789 A1* | 12/2009 | Fernandes | G11C 11/5628 365/185.03 |
| 2010/0002504 A1* | 1/2010 | Kim | G11C 7/1006 365/185.03 |
| 2011/0216586 A1* | 9/2011 | Graef | G11C 7/02 365/185.02 |
| 2011/0238903 A1* | 9/2011 | Ban | G11C 16/349 711/103 |
| 2012/0236624 A1 | 9/2012 | Costa et al. | |
| 2012/0314478 A1 | 12/2012 | Ha et al. | |
| 2013/0094275 A1 | 4/2013 | Chen | |
| 2013/0208537 A1 | 8/2013 | Roh et al. | |
| 2013/0308377 A1 | 11/2013 | Choi et al. | |
| 2014/0219001 A1 | 8/2014 | Patapoutian et al. | |
| 2014/0245098 A1* | 8/2014 | Sharon | G06F 11/1012 714/755 |
| 2014/0245108 A1 | 8/2014 | Gaertner et al. | |
| 2014/0281293 A1* | 9/2014 | Seol | G11C 7/1006 711/154 |

\* cited by examiner

RESISTIVE MEMORY SYSTEM AND METHOD OF OPERATING THE RESISTIVE MEMORY SYSTEM

CROSS-REFERENCE TO RELATED APPLICATION

This application claims the benefit of Korean Patent Application No. 10-2015-0024312, filed on Feb. 17, 2015, in the Korean Intellectual Property Office, the disclosure of which is incorporated herein in its entirety by reference.

BACKGROUND

The disclosure relates to a resistive memory device, and more particularly, to a resistive memory device including a multi-level cell and a method of operating the resistive memory system.

According to a demand for a high capacity and low power consumption of a memory device, research for next-generation memory devices that are non-volatile and do not require a refresh operation is being conducted. The next-generation memory devices are required to have a high integrity characteristic of a Dynamic Random Access Memory (DRAM), a non-volatile characteristic of a flash memory, and a high speed of a static RAM (SRAM). As the next-generation memory devices, a Phase change RAM (PRAM), a Nano Floating Gate Memory (NFGM), a Polymer RAM (PoRAM), a Magnetic RAM (MRAM), a Ferroelectric RAM (FeRAM), and a Resistive RAM (ReRAM) are being highlighted.

SUMMARY

The disclosure provides a resistive memory system having a high durability and a high data reliability, and a method of operating the resistive memory system.

According to an aspect of the disclosure, there is provided a resistive memory system including a memory device having a resistive memory cell array and a controller. The controller generates write data to be written to the memory cell array by encoding input data such that the input data corresponds to an erase state and a plurality of programming states that a memory cell may have. The input data is encoded such that at least one of the number of memory cells assigned a first programming state and the number of memory cells assigned a second programming state is smaller than at least one of the numbers of memory cells in the erase state and the other programming states. The first programming state has a highest resistance level among the plurality of programming states, and the second programming state has a second highest resistance level among the plurality of programming states.

According to another aspect of the disclosure, there is provided a resistive memory system having a memory cell array including a plurality of resistive memory cells and an encoder. The encoder generates write data, to be programmed into a memory cell array, to at least one of a plurality of states by encoding input data such that at least one of the number of memory cells to be programmed to a first state and the number of memory cells to be programmed to a second state is reduced. A resistance level of the first state is second highest among resistance levels of the plurality of states, and a resistance level of the second state is third highest among the resistance levels of the plurality of states.

According to another aspect of the disclosure, there is provided a memory controller having a processor that determines whether data is to be encoded prior to being programmed into memory cells of a nonvolatile memory. Each of the memory cells is assigned one of a plurality of un-encoded information states, respectively corresponding to programmable resistance levels of the memory cells, for representing the data. An encoder encodes the data, for an affirmative determination by the processor, such that: (1) one of a plurality of encoded information states, respectively corresponding to the programmable resistance levels, is assigned to each of the memory cells and (2) the number of memory cells to which a predetermined first encoded information state, among the encoded information states, has been assigned is always reduced with respect to the number of memory cells to which a predetermined Nth un-encoded information state, among the un-encoded information states, has been assigned.

BRIEF DESCRIPTION OF THE DRAWINGS

Exemplary embodiments of the disclosure will be more clearly understood from the following detailed description taken in conjunction with the accompanying drawings in which.

DETAILED DESCRIPTION OF THE EXEMPLARY EMBODIMENTS

Figure 1:
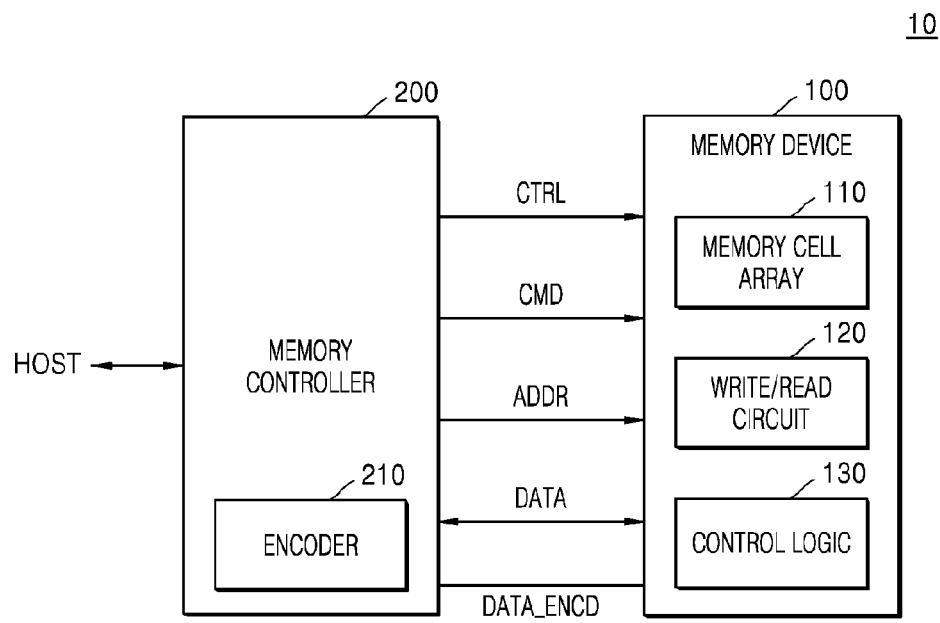
FIG. 1 is a block diagram of a memory system according to an exemplary embodiment of the disclosure.

The present disclosure will now be described more fully with reference to the accompanying drawings, in which exemplary embodiments of the disclosure are shown. The disclosure may, however, be embodied in many different forms and should not be construed as being limited to the exemplary embodiments set forth herein; rather, these embodiments are provided so that this disclosure will be thorough and complete, and will fully convey the concept of the disclosure to those skilled in the art. Thus, the disclosure may include all revisions, equivalents, or substitutions which are included in the concept and the technical scope related to the present disclosure. Like reference numerals in the drawings denote like elements. In the drawings, the dimension of structures may be exaggerated for clarity of the present disclosure.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify the existence of a recited form, a number, a process, an operation, a component, a part, and/or groups thereof, not to exclude the existence of one or more other recited forms, one or more other numbers, one or more other processes, one or more other operations, one or more other components, one or more parts, and/or groups thereof.

While the terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the disclosure.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a memory system 10 according to an exemplary embodiment of the disclosure.

Referring to FIG. 1, the memory system 10 may include a resistive memory device 100 (hereinafter, referred as the memory device 100) and a memory controller 200. The memory device 100 may include a memory cell array 110, a write/read circuit 120, and a control logic 130. Also, the memory device 100 may further include circuits performing write and read operations on the memory cell array 110 according to control of the control logic 130. Since the memory cell array 110 includes resistive memory cells, the memory system 10 may be called a resistive memory system.

In response to a write/read request from a host HOST, the memory controller 200 may control the memory device 100 to read data stored in the memory device 100 or to write data to the memory device 100. In more detail, the memory controller 200 may provide an address ADDR, a command CMD, and a control signal CTRL to the memory device 100 and thus may control a program (or write) operation, a read operation, and an erase operation with respect to the memory device 100. The memory controller 200 may transmit data DATA to be stored in the memory cell array 110 to the memory device 100 and receive read data DATA from the memory device 100.

Meanwhile, the memory controller 200 according to the present exemplary embodiment of the disclosure may include an encoder 210 to encode data that is to be stored in the memory cell array 110 (hereinafter referred to as input data) such that the input data corresponds to a plurality of resistance states of a memory cell, and may provide the memory device 100 with encoded data DATA_ENCD. The encoded data DATA_ENCD may include write data to be stored in the memory cell array 110 as data and parity bits about the write data. According to an exemplary embodiment, the memory controller 200 may control the memory device 100 such that write data and parity bits are stored in different storage regions, for example, on different pages, in different word lines, in different programming units, in different tiles, or in different blocks. According to another exemplary embodiment, the memory controller 200 may control the memory device 100 such that write data and parity bits are stored in the same storage region, for example, on the same page.

Meanwhile, the encoder 210 may encode input data such that at least one of the number of first programming states or the number of second programming states of programmed memory cells is reduced (hereinafter, encoding according to the disclosure refers to encoding whereby at least one of the number of memory cells in a first programming state and the number of memory cells in a second programming state is reduced). Memory cells may have one state from among an erase state and a plurality of programming states according to write data. Here, the erase state has the highest resistance level. According to an exemplary embodiment of the disclosure, a first programming state may denote a resistance state that is next highest to that of the erase state, and a second programming state may denote a resistance level that is next highest to the first programming state. The encoder 210 may encode input data such that the number of memory cells in the first programming state is reduced or such that the number of memory cells in the second programming state is reduced. Alternatively, the encoder 210 may encode input data such that the number of memory cells in the first programming state and the number of memory cells in the second programming state are reduced.

According to an exemplary embodiment, the encoder 210 may encode the input data such that at least one of the number of memory cells in the first programming state and the number of memory cells in the second programming state is smaller than at least one of the numbers of memory cells in other states. According to another exemplary embodiment, the encoder 210 may encode the input data such that the number of pieces of data corresponding to the first programming state or the number of pieces of data corresponding to the second programming state, from among encoded data (or write data) generated by encoding input data, is reduced to be smaller than the number of pieces of data corresponding to the first programming states or second programming states that were previously programmed to memory cells included in a region of the memory cell array 110 in which the input data is to be stored.

The encoding method as described above will be described in detail with reference to FIGS. 2A and 2B.

Figure 2A:
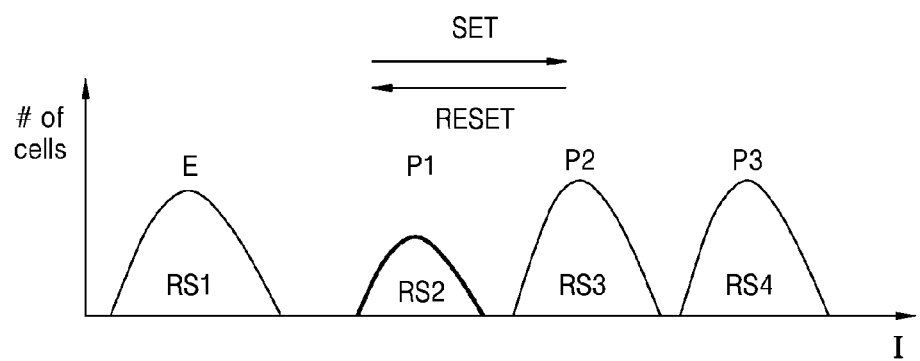
FIGS. 2A and 2B are graphs showing a resistance distribution of memory cells according to exemplary embodiments of the disclosure.
Figure 2B:
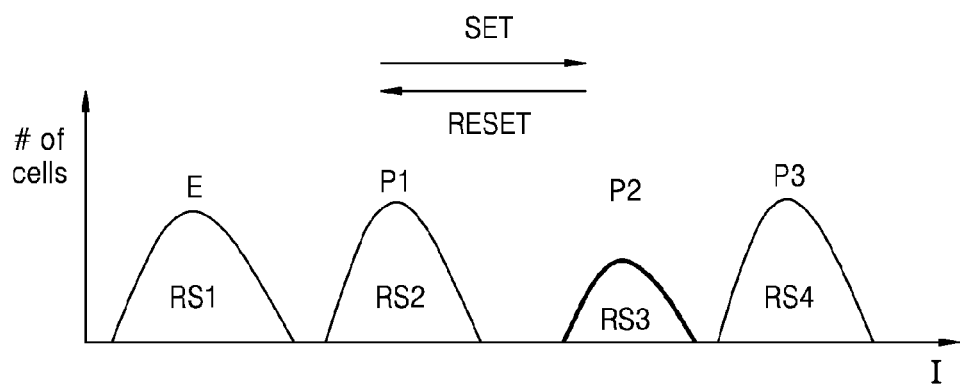

FIGS. 2A and 2B are graphs showing a resistance distribution of memory cells according to an exemplary embodiment of the disclosure. In FIGS. 2A and 2B, a horizontal axis denotes a current flowing through a memory cell, and a vertical axis denotes the number of memory cells. A current flowing through a memory cell is inversely proportional to resistance. Thus, the smaller a current, the higher is a resistance state, and the higher a current, the lower is a resistance state.

Referring to FIGS. 2A and 2B, if a memory cell MC is a multi-level cell (MLC) programmed with two bits, a resistance value of the memory cell MC may have one of a first resistance state RS1, a second resistance state RS2, a third resistance state RS3, and a fourth resistance state RS4. A resistance level may decrease in an order of the first resistance state RS1, the second resistance state RS2, the third resistance state RS3, and the fourth resistance state RS4. In other words, the first resistance state RS1 may be higher than the second resistance state RS2, the second resistance state RS2 may be higher than the third resistance state RS3, and the third resistance state RS3 may be higher than the fourth resistance state RS4.

Meanwhile, the first through fourth resistance states RS1 through RS4 may respectively correspond to an erase state E and a plurality of programming states P1 through P3. The first resistance state RS1 may be referred to as an erase state E, the second resistance state RS2 may be referred to as a first programming state P1, the third resistance state RS3 may be referred to as a second programming state P2, and the fourth resistance state RS4 may be referred to as a third programming state P3.

Each of the first, second, third, and fourth resistance states RS1, RS2, RS3, and RS4 may correspond to one of data '00', data '01', data '10', and data '11'. In the present exemplary embodiment, a resistance level may increase in order of the data '11', the data '01', the data '00', and the data '10'. That is, the fourth resistance state RS4 may correspond to the data '11', the third resistance state RS3 may correspond to the data '01', the second resistance state RS2 may correspond to the data '00', and the first resistance state RS1 may correspond to the data '10'.

An operation of applying a write pulse to the memory cell MC to switch the memory cell MC from a high resistance state to a low resistance state is referred to as a set operation or a set writing operation. Also, an operation of applying a write pulse to the memory cell MC to switch the memory cell MC from a low resistance state to a high resistance state is referred to as a reset operation or a reset writing operation.

Input data may be encoded to correspond to each of the resistance states RS1, RS2, RS3, and RS4. In other words, input data may be encoded to correspond to each of the erase state E and the plurality of programming states P1 through P3. Data obtained by encoding input data to correspond to the resistance states may be referred to as write data. Write data may be provided to the memory device 100 and programmed in the memory cell array 110 to one of the resistance states RS1, RS2, RS3, and RS4.

According to an exemplary embodiment of the disclosure, the encoder 210 may encode input data such that the number of memory cells to be programmed to the first programming state P1, that is, to the second resistance state RS2, is reduced, and accordingly, the number of memory cells corresponding to the second resistance state RS2 may be reduced. According to an exemplary embodiment, the number of memory cells corresponding to the second resistance state RS2 may be smaller than the number of memory cells respectively corresponding to the other resistance states RS1, RS3, and RS4. According to another exemplary embodiment, the number of memory cells to be programmed to the second resistance state RS2 may be reduced to be smaller than the number of memory cells of the second resistance state RS2, which were previously programmed to a region of a memory cell array.

The encoder 210 may encode input data such that the number of memory cells to be programmed to the second programming state P2, that is, to the third resistance state RS3 is reduced, and accordingly, the number of memory cells corresponding to the third resistance state RS3 may be reduced as illustrated in FIG. 2B. According to an exemplary embodiment, the number of memory cells corresponding to the third resistance state RS3 may be smaller than the number of memory cells respectively corresponding to the other resistances states RS1, RS2, and RS4. According to another exemplary embodiment, the number of memory cells to be programmed to the third resistance state RS3 may be reduced to be smaller than the number of memory cells of the third resistance state RS3, which were previously programmed to a region of a memory cell array.

The encoder 210 may also encode input data such that the number of memory cells to be programmed to the first programming state P1 and the number of memory cells to be programmed to the second programming state P2, that is, the number of memory cells in the second resistance state RS2 and the number of memory cells in the third resistance state RS3 are reduced.

Although the memory cell MC is illustrated as a 2-bit MLC in FIGS. 2A and 2B, the exemplary embodiment of the disclosure is not limited thereto, and according to another exemplary embodiment, the memory cell MC may be a triple level cell (TLC) that stores three-bit data. Accordingly, the memory cell MC may have one of eight resistance states. According to another exemplary embodiment, the memory cell MC may include memory cells that may each store at least four-bit data. In this case, also, the encoder 210 may encode input data such that at least one of the number of memory cells corresponding to the second resistance state RS2, which is a second highest resistance level from among a plurality of resistances that a memory cell may have, and the number of memory cells corresponding to the third resistance state RS3, which is a third highest resistance level from among the plurality of resistance states that a memory cell may have, is reduced. In other words, the encoder 210 may encode input data such that at least one of the number of memory cells in the first programming state P1 and the number of memory cells in the second programming state P2 is reduced.

Referring to FIG. 1 again, the encoder 210 may perform encoding as described above by using, for example, a convolution code such as a Viterbi-base code, Randermizer, Guided Scrambling, a circular shift, or a Mask-bit scheme using a random mask set such as a Hadamard matrix.

According to an exemplary embodiment, the encoder 210 may repetitively perform encoding on the input data for each data unit. For example, the encoder 210 may perform first encoding on the input data for write units, whereby data is written to a memory cell array, and then perform second encoding for units larger than the above write units.

According to an exemplary embodiment, the memory controller 200 may perform the encoding described above according to a request from a host HOST or data characteristics of input data. According to another exemplary embodiment, the memory controller 200 may determine data characteristics of input data or receive information about data characteristics of the input data, and determine whether to perform the encoding or not based on the data characteristics. The memory controller 200 may perform encoding if it is determined that input data is data that requires reliability (for example, secure data such as password information or various types of metadata) or data that is not frequently updated and is stored in the memory cell array 110 for a certain or long amount of time.

According to another exemplary embodiment, the memory controller 200 may determine cell deterioration of memory cells included in a region of the memory cell array 110 in which the input data is to be stored, and may determine whether to perform encoding based on the determination result. The memory controller 200 may read data stored in the region and determine cell deterioration of the region based on the number of errors, an update frequency, a retention time of the read data, or the number of times the region is erased or overwritten. When cell deterioration is anticipated, the memory controller 200 may perform encoding. As described above, the memory controller 200 may further include an encoding determining unit (not shown) that determines whether to perform encoding on input data or not.

Although not illustrated, the memory controller 200 may include Random Access Memory (RAM), a processing unit, a host interface, and a memory interface. The RAM may be used as an operation memory of the processing unit. The processing unit may control operations of the memory controller 200. The host interface may include a protocol for exchanging data between the host and the memory controller 200. For example, the memory controller 200 may communicate with an external source (i.e., the host) by using at least one of various interface protocols including USB, MMC, PCI-E, Advanced Technology Attachment (ATA), Serial-ATA, Parallel-ATA, SCSI, ESDI, and IDE.

The memory cell array 110 may include a plurality of memory cells (not shown) that are respectively disposed in regions where a plurality of first signal lines and a plurality of second signal lines cross each other. According to an exemplary embodiment, the plurality of first signal lines may be a plurality of word lines and the plurality of second signal lines may be a plurality of bit lines, or vice versa.

In the present exemplary embodiment, each of the memory cells may be a multilevel cell (MLC) that may store at least two-bit data. Alternatively, the memory cell array 110 may include both single-level cells (SLCs) and MLCs. When one bit data is written to one memory cell, the memory cells may have two resistance level distributions according to the written data. Alternatively, when two-bit data is written to one memory cell, the memory cells may have four resistance level distributions according to the written data. In another exemplary embodiment, if a memory cell is a TLC that stores three-bit data, the memory cells may have eight resistance level distributions according to the written data. However, one or more exemplary embodiments of the disclosure are not limited thereto. According to another exemplary embodiment, each of the memory cells may store at least four-bit data.

Also, in the present exemplary embodiment, the memory cell array 110 may include memory cells in a two-dimensional horizontal structure. In another exemplary embodiment, the memory cell array 110 may include memory cells with a three-dimensional vertical structure.

According to the exemplary embodiment, the memory cell array 110 may include a plurality of cell regions. The plurality of cell regions may be defined in various ways, for example, each of the cell regions may be a page unit including a plurality of memory cells connected to the same word line. As another example, the cell region may include a plurality of memory cells that are connected to the word lines and bit lines, and the word lines may be connected to one row decoder and the bit lines may be connected to one column decoder. In addition, the cell region may be defined as a tile.

The memory cell array 110 may include resistance-type memory cells or resistive memory cells that include a variable resistor device (not shown) having a variable resistor. For example, when the resistance of the variable resistor device that is formed of a phase change material (e.g., Ge—Sb—Te) changes according to temperature, a resistive memory device may be Phase-change RAM (PRAM). As another example, when the variable resistor device is formed of complex metal oxide including an upper electrode, a lower electrode, and transition metal oxide therebetween, the resistive memory device may be Resistive RAM (ReRAM). As another example, when the variable resistor device is formed of an upper electrode of a magnetic material, a lower electrode of a magnetic material, and a dielectric therebetween, the resistive memory device may be Magnetic RAM (MRAM). Hereinafter, it is assumed that the memory cell array 110 is ReRAM.

The write/read circuit 120 may perform write and read operations on the memory cells. The write/read circuit 120 is connected to the memory cells via the plurality of bit lines, and may include a write driver for writing data in the memory cells and a sense amplifier for amplifying data read from the memory cells. The write/read circuit 120 may provide memory cells that are selected by a row decoder (not shown) and a column decoder (not shown), from among a plurality of cells, with a current pulse or a voltage pulse to thereby perform write and read operations on the memory cell.

The control logic 130 may control overall operations of the memory device 100, and may control the write/read circuit 120 for performing memory operations such as the read and write operations.

When performing a write operation on the memory device 100, a resistance level of the variable resistor of the memory cell in the memory cell array 110 may increase or may reduce according to written data. For example, each of the memory cells in the memory cell array 110 may have a resistance value according to currently stored data, and the resistance value may be increased or reduced according to the data to be written on the memory cell. The writing operation as described above may be classified as a reset writing operation and a set writing operation. In the resistive memory cell, a set status has a relatively low resistance level and a reset status may have a relatively high resistance level.

In a ReRAM, when a set write operation is performed, a vacancy may be formed due to movement of oxygen ions, a filament formed of an oxygen vacancy may be formed, and this may reduce a resistance level of a memory cell. When a reset write operation is performed, as oxygen ions recombine with the vacancy, the filament may be cut to thereby increase a resistance level of a memory cell.

Figure 3:
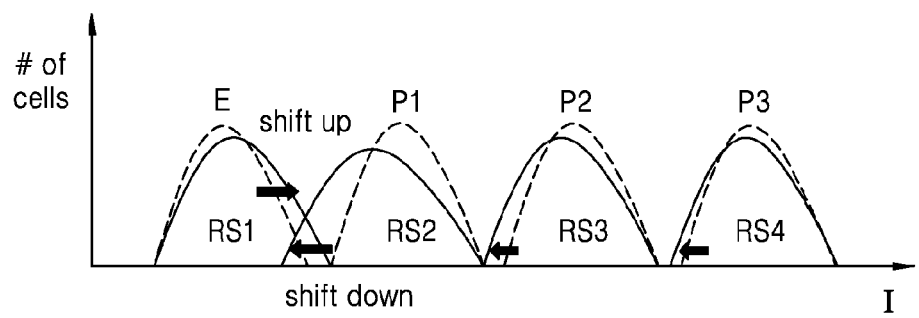
FIG. 3 is a graph showing a change in resistance distribution of memory cells.

When a long period of time passes after a memory cell is programmed, the filament may be weakened to increase a resistance level of the memory cell. In particular, from among programming states, as the resistance level of a memory cell increases, the variation of said resistance level also increases. Accordingly, as illustrated in FIG. 3, a resistance distribution (i.e., the second resistance state RS2) of the first programming state P1, which has the highest resistance level from among programming states, may be increased in a direction of increasing resistance, and a variation of the resistance level of the first programming state may be the greatest. A resistance distribution (i.e., the third resistance state RS3) of the second programming state P2, which has the second highest resistance level may be increased in a direction of increasing resistance, and variation of the resistance level of the second programming state P2 may be the second greatest.

Meanwhile, when programming and erase operations on a memory cell are repeated, the combination of oxygen and an oxygen vacancy is not easy and this may reduce resistance of the memory cell. In particular, such a tendency may be greater in a relatively high resistance state, and thus, as illustrated in FIG. 3, a distribution of an erase state E, that is, of the first resistance state RS1 may increase in a direction of reducing resistance.

Due to a change in a resistance distribution of memory cells as described above, distributions between the resistance states RS1 through RS4 may be overlapped, and in this case, a read error may be generated when data is read from a memory cell. In particular, a read error is highly likely to be caused in the first programming state P1 or the second programming state P2 which has a relatively high resistance level.

Thus, according to the memory system 10 of the exemplary embodiment of the disclosure, a resistance distribution of a memory cell may be improved and read error may be reduced by encoding input data in a direction of reducing at least one of the number of memory cells in the first programming state P1 and the number of memory cells in the second programming state P2, that is, such that at least one of the number of memory cells in the second resistance state RS2 and the number of memory cells in the third resistance state RS3 is reduced. Accordingly, in the memory system 10, durability of the memory device 100 may be improved, and data reliability may be improved.

In addition, the memory controller 200 and the memory device 100 may be integrated as one semiconductor device. For example, the memory controller 200 and the memory device 100 may be integrated as one semiconductor device forming a memory card. For example, the memory controller 200 and the memory device 100 may be integrated into one semiconductor device and thus may configure a PC card (a PCMCIA card), a compact flash card (CF card), a smart media card (SM/SMC), a memory stick, a multimedia card (MMC, RS-MMC, or MMCmicro, an SD card (SD, miniSD, or microSD), or a universal flash storage (UFS). As another example, the memory controller 200 and the memory device 100 may be integrated into one semiconductor device and thus may form a Solid State Disk/Drive (SSD).

Figure 4:
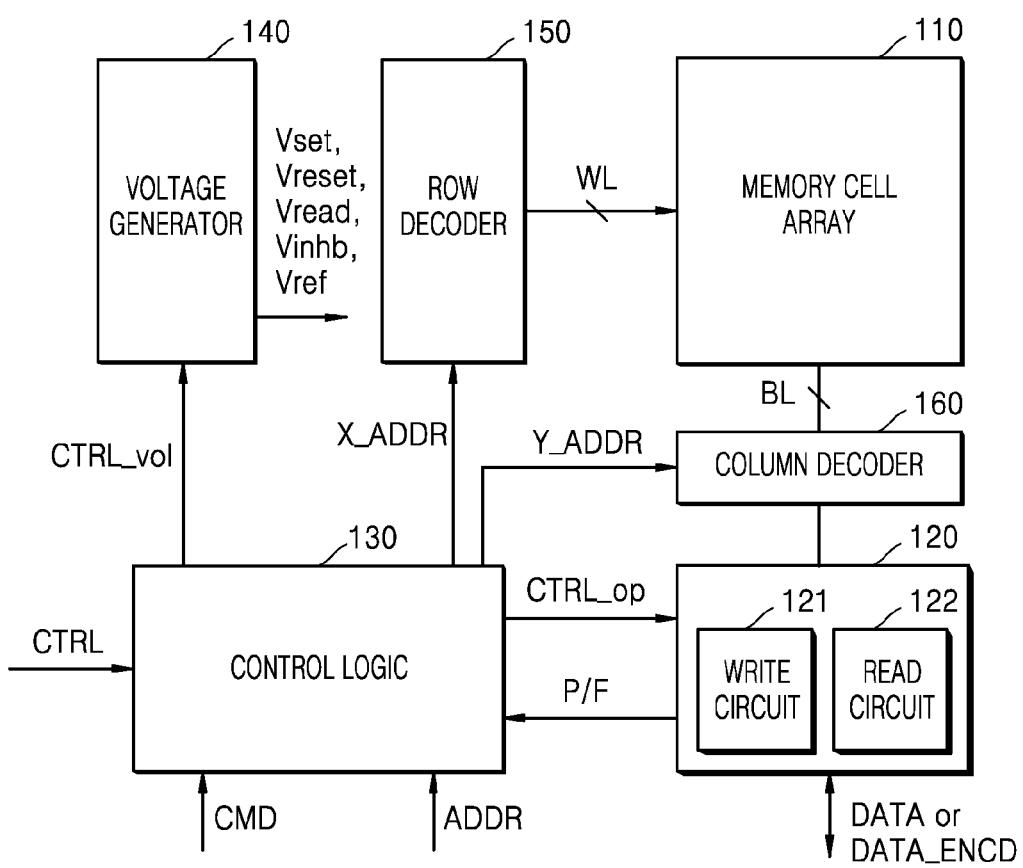
FIG. 4 is a block diagram of a memory device according to an exemplary embodiment of the disclosure.

FIG. 4 is a block diagram of a memory device 100 according to an exemplary embodiment of the disclosure.

Referring to FIG. 4, the memory device 100 may include the memory cell array 110, the write/read circuit 120, the control logic 130, and a voltage generator 140. In addition, the memory device 100 may further include a row decoder 150 and a column decoder 160. The write/read circuit 120 may include a write circuit 121 and a read circuit 122.

The memory cell array 110 may be connected to the plurality of first signal lines and the plurality of second signal lines. Also, the memory cell array 110 may include a plurality of memory cells that are respectively arranged on regions where the plurality of first signal lines and the plurality of second signal lines cross each other. Hereinafter, it is assumed that the plurality of first signal lines are word line WL, and the plurality of second signal lines are bit lines BL.

An address ADDR for indicating an access-target memory cell may be received with a command CMD by the control logic 130. The address ADDR may include a row address X_ADDR for selecting a word line WL of the memory cell array 110, and a column address Y_ADDR for selecting a bit line BL of the memory cell array 110. The row decoder 150 is connected to the memory cell array 110 via the word lines WL, and may select at least one of the word lines in response to the row address X_ADDR. The column decoder 160 is connected to the memory cell array 110 via the bit lines BL, and may select at least one of the bit lines BL in response to the column address Y_ADDR.

The write/read circuit 120 may write data DATA input from outside in the memory cell array 110 or output the data written in the memory cell array 110 to the outside, according to control of the control logic 130. Also, the write/read circuit 120 may provide the control logic 130 with a writing or reading result. For example, the write/read circuit 120 performs a verification operation in order to detect the result of the writing operation, and may provide the control logic 130 with the verification result, for example, pass or fail signal P/F.

The write/read circuit 120 may be selectively connected to the row decoder 150 or the column decoder 160, and accordingly, is selectively connected to the word line WL or the bit line BL to write data in the memory cell or read data from the memory cell.

The write/read circuit 120 may include the write circuit 121 and the read circuit 122. The write circuit 121 is connected to the selected bit line BL via the column decoder 160 to provide the selected memory cell MC with a program pulse, and thus, performs a programming operation (that is, the writing operation). Thus, the data DATA to be stored may be input to the memory cell array 110. Here, the programming pulse may be referred to as a writing pulse. According to an exemplary embodiment, the programming pulse may be a current pulse. According to another exemplary embodiment, the program pulse may be a voltage pulse.

In detail, the write circuit 121 may perform the set writing operation that programs the memory cell MC so that the resistance of the memory cell MC is reduced. Also, the write circuit 121 may perform the reset writing operation that programs the memory cell MC so that the resistance of the memory cell MC is increased.

The read circuit 122 is connected to the selected bit line BL via the column decoder 160, and may read the data DATA by sensing the resistance level of the selected memory cell MC. The read circuit 122 may sense a voltage of the bit line BL and compare the sensed voltage with a reference voltage Vref to thereby determine a resistance level of the selected memory cell MC. According to an exemplary embodiment of the disclosure, when the memory cell MC is a MLC, the read circuit 122 may determine a resistance level of the selected memory cell MC by comparing the sensed voltage of the bit line BL with a plurality of reference voltages Vref.

In detail, the read circuit 122 may perform a general reading operation on the memory cell MC if a reading command is transmitted from the memory controller 200. Also, the read circuit 122 may perform the reading operation on the memory cell MC before performing the writing operation on the memory cell MC, that is, a pre-reading operation for reading an initial resistance state of the memory cell MC.

Moreover, the read circuit 122 may perform a verify reading operation for determining whether the writing in the memory cell MC is finished, after performing the writing operation on the memory cell MC.

In a general reading operation, the read circuit 122 may provide the read data DATA to outside of the memory device 100, for example, the memory controller 200. Also, in the pre-reading operation or the verify reading operation, the read circuit 122 may provide the read data DATA or a P/F signal representing whether the reading or writing of the data has succeeded or not to inside of the memory device 100, for example, the control logic 130 or the write circuit 121, as a result of the writing/reading operations.

In one exemplary embodiment, the write circuit 121 and the read circuit 122 may be connected to the word line WL. In another exemplary embodiment, the write circuit 121 and the read circuit 122 may be connected to the bit line BL. In another exemplary embodiment, the write circuit 121 may be connected to the word line WL and the read circuit 122 may be connected to the bit line BL. In another exemplary embodiment, the write circuit 121 may be connected to the bit line BL and the read circuit 122 may be connected to the word line WL.

The voltage generator 140 may generate various voltages for performing the writing, reading, and erasing operations with respect to the memory cell array 110 based on a voltage control signal CTRL_vol. The voltage generator 140 may generate voltages for driving the plurality of word lines WL and bit lines BL, for example, a set writing voltage Vset, a reset writing voltage Vreset, a read voltage Vread, and inhibit voltages Vinhb. Also, the voltage generator 140 may generate a reference voltage for reading data stored in the memory cell MC.

The control logic 130 may output various control signals for writing data DATA or encoded data DATA_ENCD in or reading data DATA from the memory cell array 110 based on the command CMD, the address ADDR, and the control signal CTRL transmitted from the memory controller 200. The various control signals output from the control logic 130 may be provided to the write/read circuit 120, the voltage generator 140, the row decoder 150, and the column decoder 160, and accordingly, the control logic 130 may control overall operations in the memory device 100.

In detail, the control logic 130 may generate various operation control signals CTRL_op based on the command CMD and the control signal CTRL, and may provide the write/read circuit 120 with the operation control signals CTRL_op.

Also, the control logic 130 may provide the row decoder 150 with a row address X_ADDR, and may provide the column decoder 160 with a column address Y_ADDR.

Also, the control logic 130 may generate a voltage control signal CTRL_vol based on the command CMD, the control signal CTRL, and the P/F signal transmitted from the read circuit 122.

Figure 5:
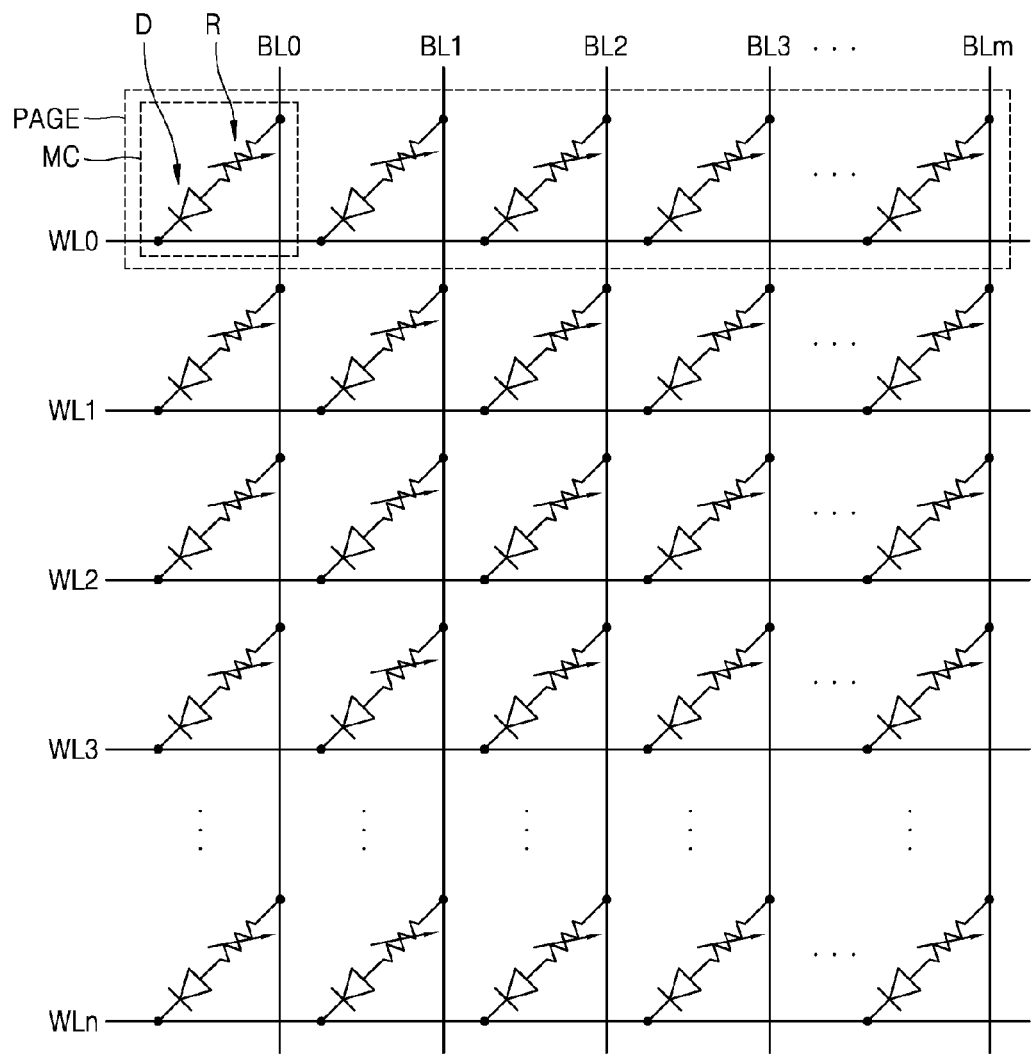
FIG. 5 is a circuit diagram of a memory cell array of FIG. 4 according to an exemplary embodiment.

FIG. 5 is a circuit diagram of the memory cell array 110 of FIG. 4 according to an exemplary embodiment.

Referring to FIG. 5, the memory cell array 110 may be a horizontal two-dimensional memory, and include a plurality of word lines WL0-WLn, a plurality of bit lines BL0-BLm, and a plurality of memory cells MCs. A group of the memory cells MC selected by the same word line WL may be defined as a page PAGE. Here, the number of word lines WL, the number of bit lines BL, and the number of memory cells MC may vary depending on exemplary embodiments. Although FIG. 4 shows the two-dimensional memory of the horizontal structure, one or more exemplary embodiments are not limited thereto, that is, the memory cell array 110 may be a three-dimensional array of a vertical structure.

According to the present exemplary embodiment, each of the plurality of memory cells MC may include a variable resistive device R and a selection device D. Here, the variable resistance device R may be referred to as a variable resistance material, and the selection device D may be referred to as a switching device.

In the present exemplary embodiment, the variable resistance device R is connected between one of the plurality of word lines WL0-WLn and the selection device D, and the selection device D may be connected between the variable resistance device R and one of the plurality of bit lines BL0-BLm. However, the one or more exemplary embodiments of the present disclosure are not limited thereto, that is, the selection device D may be connected between one of the plurality of word lines WL0-WLn and the variable resistance device R, and the variable resistance device R may be connected between the selection device D and one of the plurality of bit lines BL0-BLm.

According to the present exemplary embodiment, the variable resistance device R may be switched to one of a plurality of resistance states by an electric pulse applied thereto. According to an exemplary embodiment, the variable resistance device R may include a phase-change material, a crystallization status of which varies depending on an amount of electric current. The phase-change material may vary, and may be, for example, GaSb, InSb, InSe, $Sb_2Te_3$, or GeTe that are compounds of two elements, GeSbTe, GaSeTe, InSbTe, $SnSb_2Te_4$, or InSbGe that are compounds of three elements, and AgInSbTe, (GeSn)SbTe, GeSb(SeTe), or $Te_{81}Ge_{15}Sb_2S_2$ that are compounds of four elements.

The phase-change material may be in an amorphous state having a relatively high resistance and a crystalline state having a relatively low resistance. The phase of the phase-change material may be changed by Joule's heat generated according to the amount of electric current. In addition, data may be written by using the phase change.

In addition, according to another exemplary embodiment, the variable resistance device R may include perovskite compounds, a transmission metal oxide, magnetic materials, ferromagnetic materials, or antiferromagnetic materials, instead of the phase-change material.

The selection device D may be connected between one of the plurality of word lines WL0-WLn, and the variable resistance material R, and may control supply of the electric current to the variable resistance device R according to a voltage applied to the connected word line and the bit line.

According to an exemplary embodiment, the selection device D may be a PN junction diode or a PIN junction diode. An anode of the device D may be connected to the variable resistance device R, and a cathode of the diode may be connected to one of the plurality of word lines WL0-WLn. Here, if a voltage difference between the anode and the cathode of the diode becomes greater than a threshold voltage of the diode, the diode is turned on so as to supply the electric current to the variable resistance device R. In FIG. 5, the selection device D is shown as a diode; however, one or more exemplary embodiments of the disclosure are not limited thereto, that is, the selection device D may be another device that may be switched.

Figure 6:
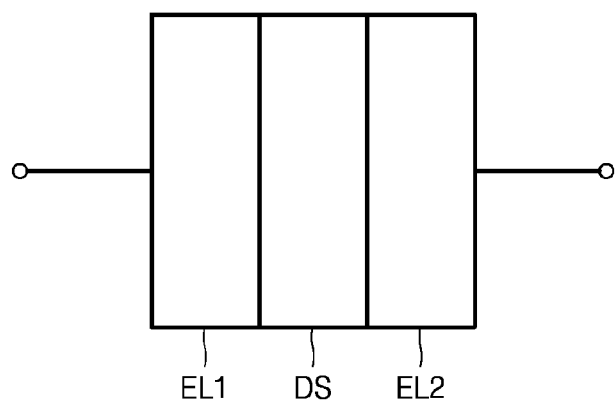
FIG. 6 illustrates a variable resistor device included in a memory cell of FIG. 5 according to an exemplary embodiment.

FIG. 6 is a diagram of the variable resistance device R included in the memory cell MC of FIG. 5 according to an exemplary embodiment.

Referring to FIG. 6, the variable resistance device R includes first and second electrodes EL1 and EL2, and a data storage film DS disposed between the first and second electrodes EL1 and EL2.

The first and second electrodes EL1 and EL2 may be formed of various metals, metal oxides, or metal nitrides. The first and second electrodes EL1 and EL2 may be formed of aluminium (Al), copper (Cu), titanium nitride (TiN), titanium aluminium nitride (TixAlyNz), iridium (Ir), platinum (Pt), silver (Ag), gold (Au), poly silicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), tin (Sn), zirconia (Zr), zinc (Zn), iridium oxide ($IrO_2$), or strontium zirconate oxide ($StZrO_3$).

The data storage film DS may be a bipolar resistive memory material or a unipolar resistive memory material. The bipolar resistive memory material may be programmed as a set state or a reset state according to a polarity of the pulse, and the unipolar resistive memory material may be a perovskite-based material. In addition, the unipolar resistive memory material may be programmed as a set state or a reset state according to the pulses of the same polarity, and the unipolar resistive memory material may be a transition metal oxide such as NiOx or TiOx.

Figure 7A:
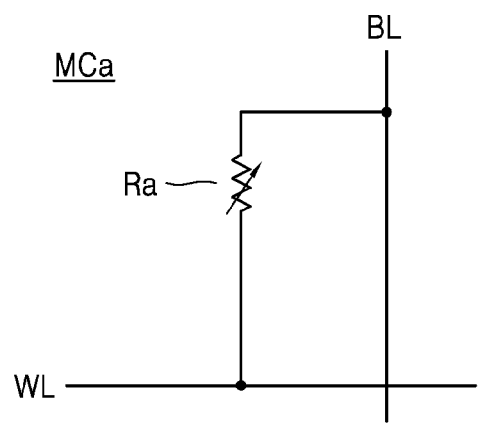
FIGS. 7A through 7C are circuit diagrams showing modified examples of the memory cell of FIG. 5.
Figure 7B:
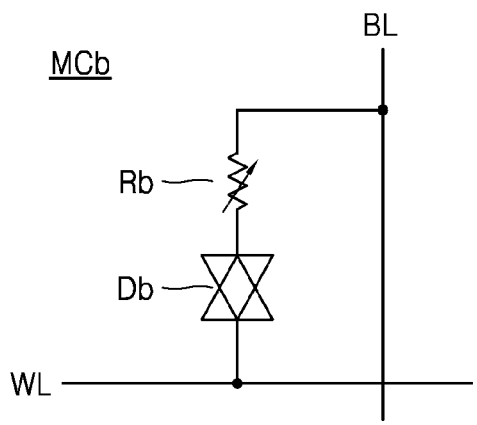
Figure 7C:
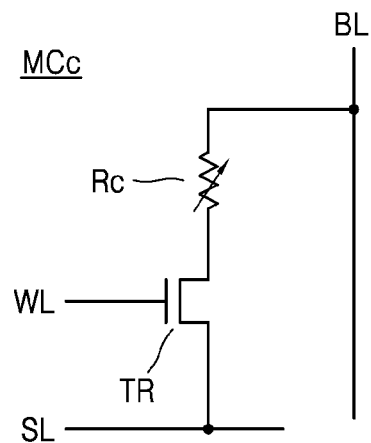

FIGS. 7A through 7C are circuit diagrams showing modified examples of the memory cell MC shown in FIG. 5.

Referring to FIG. 7A, a memory cell MCa includes a variable resistance device Ra, and the variable resistance device Ra may be connected between a bit line BL and a word line WL. The memory cell MCa may store data by using voltages applied to the bit line BL and the word line WL.

Referring to FIG. 7B, a memory cell MCb may include a variable resistance device Rb and a bidirectional diode Db. The variable resistance device Rb may include a resistor material for storing data. The bidirectional diode Db is connected between the variable resistance device Rb and the word line WL, and the variable resistance device Rb may be connected between the bit line BL and the bidirectional diode Db. Locations of the bidirectional diode Db and the variable resistance device Rb may be exchanged. A leakage current flowing in non-selected resistor cells may be blocked by the bidirectional diode Db.

Referring to FIG. 7C, a memory cell MCc may include a variable resistance device Rc and a transistor TR. The transistor TR may be a selection device for supplying or blocking the electric current to the variable resistance device Rc according to a voltage of the word line WL, that is, a switching device. The transistor TR is connected between the variable resistance device Rc and the source line SL, and the variable resistance device Rc may be connected between the bit line BL and the transistor TR. Locations of the transistor TR and the variable resistance device Rc may be exchanged. The memory cell MCc may be selected or may not be selected according to turning on/turning off of the transistor TR that is driven by the word line WL.

Figure 8:
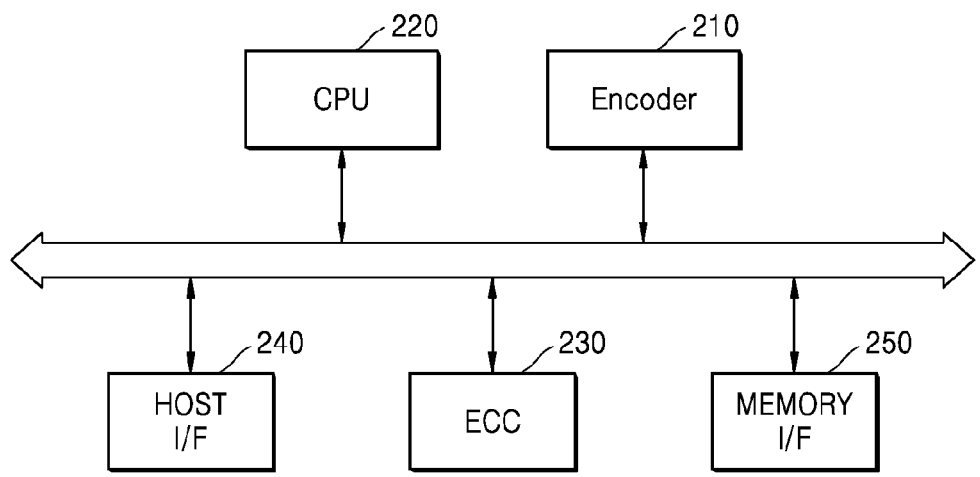
FIG. 8 is a block diagram of a memory controller according to an exemplary embodiment of the disclosure.

FIG. 8 is a block diagram of a memory controller 200 according to an exemplary embodiment of the disclosure.

Referring to FIG. 8, the memory controller 200 may include an encoder 210, a CPU 220, an error correction code (ECC) unit 230, a host interface 240, and a memory interface 250. Also, although not illustrated in FIG. 8, the memory controller 200 may also include other various elements such as a read only memory (ROM) storing code data needed for initial booting of a device, in which the memory system 10 is mounted, or a buffer memory controller controlling a buffer memory device.

The host interface 240 provides an interface between a host and the memory controller 200 and receives a request for a memory operation from the host. For example, the host interface 240 may receive various requests on reading and writing or the like, and generate various internal signals for a memory operation on the memory device 100 according to the requests. For example, the memory controller 200 may communicate with the host via various standard interfaces. The standard interfaces may include various interface methods such as Advanced Technology Attachment (ATA), serial ATA (SATA), external SATA (e-SATA), Parallel-ATA, Small Computer Small Interface (SCSI), serial attached SCSI (SAS), Peripheral Component Interconnection (PCI), PCI express (PCI-E), IEEE 1394, Universal Serial Bus (USB), Integrated Drive Electronics (IDE), secure digital (SD) card, Multi Media Card (MMC), embedded MMC (eMMC), or Compact Flash (CF) card.

The CPU 220 may control an overall operation of the memory controller 200. For example, the CPU 220 may control various functional blocks related to a memory operation on the memory device 100. Also, the CPU 220 may be configured to drive firmware to control the memory controller 200.

The ECC unit 230 may perform ECC encoding on write data and ECC decoding on read data, and thus may generate an error detection result about data read from the memory device 100, and perform an error correction operation on the read data. The ECC unit 230 may perform ECC encoding and decoding on each piece of data of a predetermined unit. For example, sector data may be defined as a unit of ECC encoding and decoding.

The ECC unit 230 may perform ECC encoding and ECC decoding by using an algorithm such as a Reed-Solomon (RS) code, a Hamming code, or a Cyclic Redundancy Code (CRC). ECC encoding processing includes an operation of generating a parity bit based on data to be written, and ECC decoding processing includes an operation of detecting an error bit from read data and correcting the detected error bit. For example, the ECC unit 230 may compare a parity bit that is generated and stored when programming data, with a parity bit that is generated when reading data, to thereby detect an error bit, and perform a predetermined logical operation on the detected error bit (e.g., exclusive- or (XOR) operation) to thereby correct the error bit.

The ECC unit 230 may be set to have a predetermined error correction rate. The higher an error correction rate, the greater may be the number of parity bits generated for each piece of data of the same size. For example, the higher an error correction rate, the more bits of error may be corrected per a predetermined data size (or a predetermined ECC unit).

Although the ECC unit 230 is illustrated as an internal component of the memory controller 200 in FIG. 8, a function of the ECC unit 230 may also be configured in the memory device 100.

The memory interface 250 may provide an interface between the memory controller 200 and the memory device 100, and, for example, write data and read data may be transmitted or received to or from the memory device 100 via the memory interface 250. Also, the memory interface 250 may further provide an interface between the memory controller 200 and a buffer memory device (not shown).

As described above with reference to FIG. 1, the encoder 210 may encode input data such that at least one of the number of memory cells in the first programming state P1 and the number of memory cells in the second programming state P2 is reduced. For example, the encoder 210 may encode input data such that at least one of the number of memory cells in the first programming state P1 and the number of memory cells in the second programming state P2 is smaller than at least one of the numbers of memory cells in other states. Alternatively, the encoder 210 may encode the input data, such that the number of pieces of data corresponding to the first programming state P1 or the number of pieces of data corresponding to the second programming state P2 is reduced to be smaller than the number of pieces of data corresponding to the first programming states P1 or the number of pieces of data corresponding to the second programming states P2 that were previously programmed to memory cells included in a region in the memory cell array 110, in which the encoded input data is to be stored.

Figure 9:
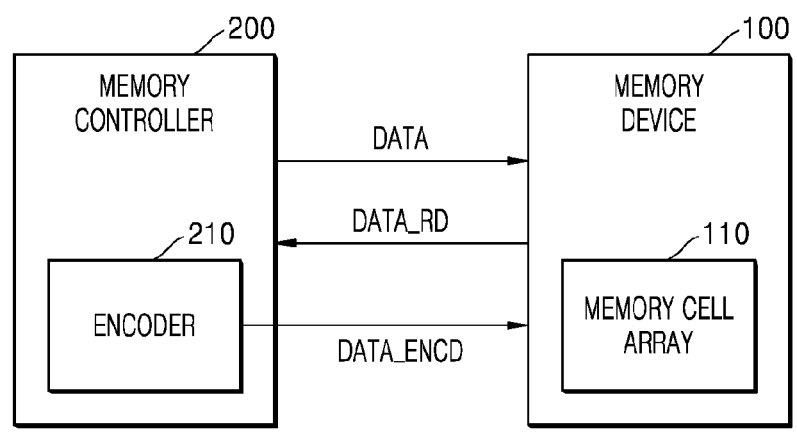
FIG. 9 is a block diagram illustrating a method of operating a memory system according to an exemplary embodiment of the disclosure.

FIG. 9 is a block diagram illustrating a method of operating a resistive memory system according to an exemplary embodiment of the disclosure. According to the present exemplary embodiment, the memory controller 200 may read data from a memory cell, and perform encoding with encoder 210, whereby at least one of the number of memory cells in the first programming state P1 and the number of memory cells in the second programming state P2 is reduced based on the read data. That is, the encoder 210 may perform the encoding according to the exemplary embodiments of the disclosure. For example, the memory controller 200 may perform encoding on input data in regard to a refresh process, a garbage collection process or a data comparison write process with respect to data included in a memory cell. According to an exemplary embodiment, if deterioration of a memory cell is predicted, the memory controller 200 may perform encoding on input data. According to another exemplary embodiment, the memory controller 200 may always perform encoding on input data.

Referring to FIG. 9, the memory controller 200 may transmit data DATA to the memory device 100, and the memory device 100 may write data DATA to a predetermined region of the memory cell array 110. If rewriting is performed on the stored data DATA as, for example, in a refresh process or a garbage collection process, or if data DATA that is previously written to the memory device 100 and data to be newly written are compared as in a data comparison write operation (for example, data, which is requested by a host to be stored, or updated data), and writing of only changed data is performed, the memory controller 200 may read stored data from the memory cell array 110 and receive the read data DATA_RD. The memory controller 200 may perform encoding on input data and provide the encoded data DATA_ENCD to the memory cell array 110.

According to an exemplary embodiment, the memory controller 200 may determine deterioration of a memory cell of a region in which data DATA is stored, based on the read data DATA_RD. For example, the memory controller 200 may determine deterioration of a memory cell based on the number of errors, an update frequency, or a retention time of the read data DATA_RD. Alternatively, the memory controller 200 may determine deterioration of a memory cell based on the number of times the region, in which the read data DATA_RD is stored, is overwritten or erased.

The memory controller 200 may perform encoding on input data if it is determined that a memory cell is deteriorated or deterioration of a memory cell is anticipated, and may control the memory device 100 such that the encoded data DATA_ENCD is written to the memory cell array 110. According to an exemplary embodiment, input data may be data obtained by performing ECC on the read data DATA_RD. Alternatively, input data may be data that is newly stored in the region where the read data DATA_RD is stored.

Figure 10:
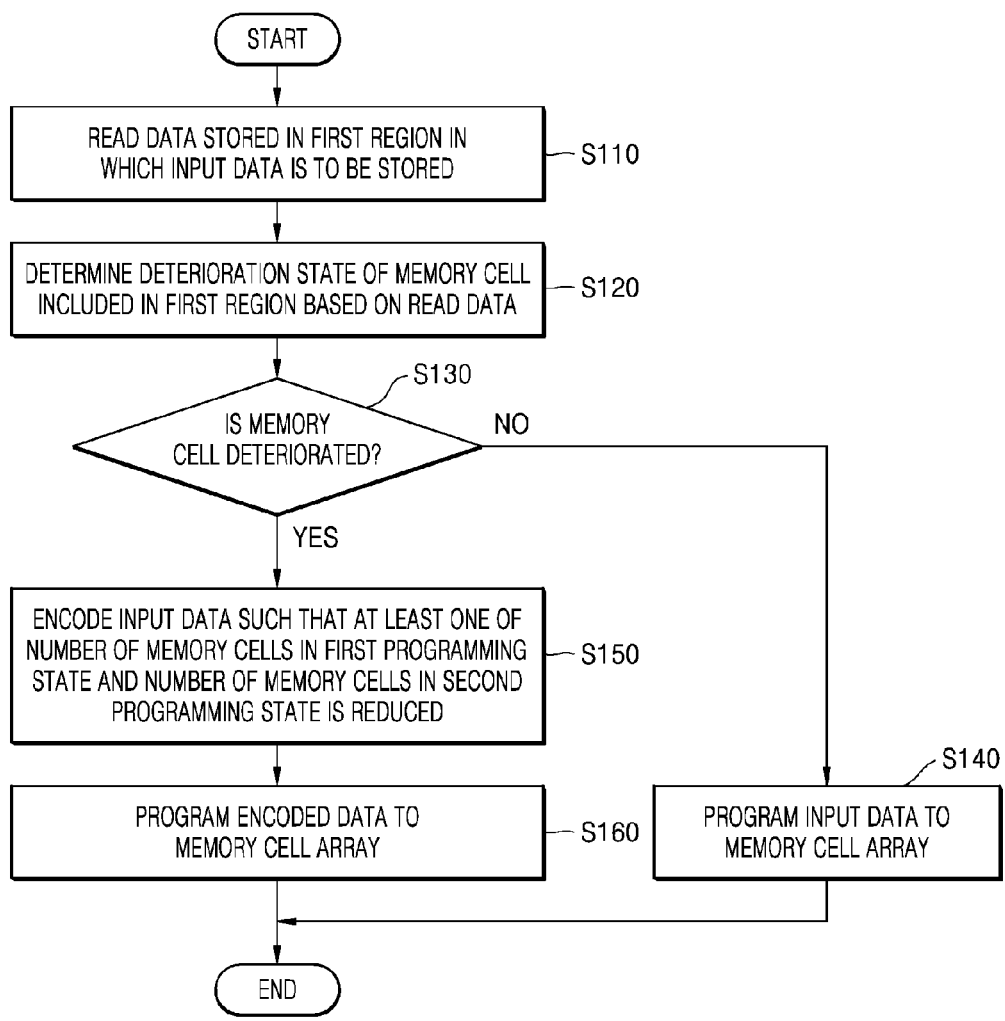
FIG. 10 is a flowchart of a method of operating a memory system according to an exemplary embodiment of the disclosure.

FIG. 10 is a flowchart of a method of operating a memory system according to an exemplary embodiment of the disclosure. The method of operating a memory system of FIG. 10 is a method of programming input data, and details described with reference to FIG. 9 may also apply to the method of operating a memory system of the present exemplary embodiment.

Referring to FIG. 10, the memory controller 200 may read data stored in a first region in which input data is to be stored, in operation S110. The first region may be a region of the memory cell array 110. The first region may be a region corresponding to a write unit of the memory cell array 110. Alternatively, the first region may be a region corresponding to a page unit.

The memory controller 200 may determine, in operation S120, a deterioration state of a memory cell included in the first region based on read data. For example, the memory controller 200 may determine a deterioration state of a memory cell based on the number of errors, an update frequency or a retention time of read data DATA_RD. Alternatively, the memory controller 200 may determine a deterioration state of a memory cell based on the number of times the first region is erased or overwritten.

The memory controller 200 may determine whether a memory cell is deteriorated or deterioration of a memory cell is anticipated in operation S130, and when it is determined that a memory cell is deteriorated or deterioration of a memory cell is anticipated, the memory controller 200 may encode input data in operation S150, and may program encoded data to a memory cell array in operation S160. According to an embodiment, the memory controller 200 may encode the input data such that at least one of the number of memory cells in a first programming state and the number of memory cells in a second programming state is smaller than at least one of the numbers of memory cells in other states. According to another exemplary embodiment, the memory controller 200 may encode the input data such that at least one of the number of pieces of data corresponding to the first programming state or the number of pieces of data corresponding to the second programming state, from among encoded data, is reduced to be smaller than the number of pieces of data corresponding to the first programming state or the number of pieces of data corresponding to the second programming state, from among the read data. Here, the encoded data may be programmed to the first region. Alternatively, the encoded data may be programmed to other regions.

When it is determined that a memory cell is not deteriorated or deterioration is not anticipated, the memory controller 200 may program the input data to a memory cell array without performing the encoding described above on the input data, in operation S140.

Figure 11:
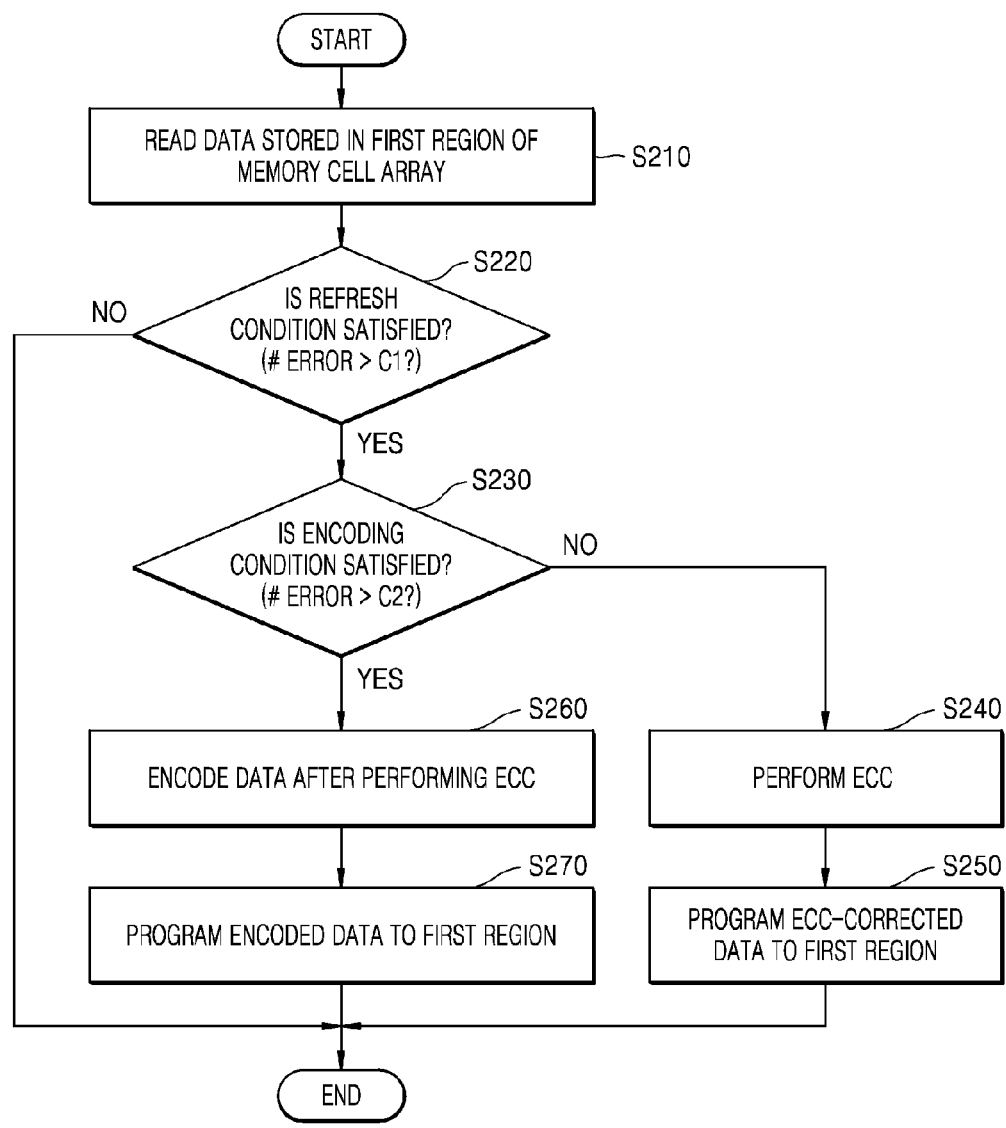
FIG. 11 is a flowchart of a method of operating a memory system according to an exemplary embodiment of the disclosure.

FIG. 11 is a flowchart of a method of operating a memory system according to an exemplary embodiment of the disclosure. The method of operating a memory system of FIG. 11 is a refresh operation, and details described with reference to FIG. 9 may also apply to the method of operating a memory system of the present exemplary embodiment.

Referring to FIG. 11, the memory controller 200 reads data stored in a first region of the memory cell array 110 in operation S210.

The memory controller 200 may determine whether a refresh condition is satisfied or not based on the read data in operation S220. For example, the memory controller 200 may determine whether a refresh condition is satisfied, based on the number of errors of the read data. If the number of errors exceeds a first reference value C1, the memory controller 200 may determine that a refresh condition is satisfied.

When a refresh condition is satisfied, the memory controller 200 may determine whether an encoding condition is satisfied in operation S230. For example, the memory controller 200 may determine whether the number of errors exceeds a predetermined second reference value C2. Alternatively, the memory controller 200 may determine whether an encoding condition is satisfied based on whether the number of times the first region is erased exceeds a predetermined reference value or whether an erase cycle of the first region exceeds a predetermined time.

If the number of errors of data is equal to or less than the second reference value C2, the memory controller 200 may determine that an encoding condition is not satisfied. If the number of errors of data is equal to or less than the second reference value C2, the memory controller 200 may determine that deterioration of a memory cell is not anticipated. The memory controller 200 may perform ECC on read data in operation 5240, and program the ECC-corrected data to the first region in operation 5250.

If the number of errors of data exceeds the second reference value C2, the memory controller 200 may determine that an encoding condition is satisfied. If the number of errors of data exceeds the second reference value C2, the memory controller 200 may determine, for example, that deterioration of a memory cell is anticipated. After performing ECC on read data, the memory controller 200 may encode the ECC-corrected data in operation 5260. Next, the memory controller 200 may program encoded data to the first region in operation 5270. The data of the first region may be refreshed accordingly.

Figure 12:
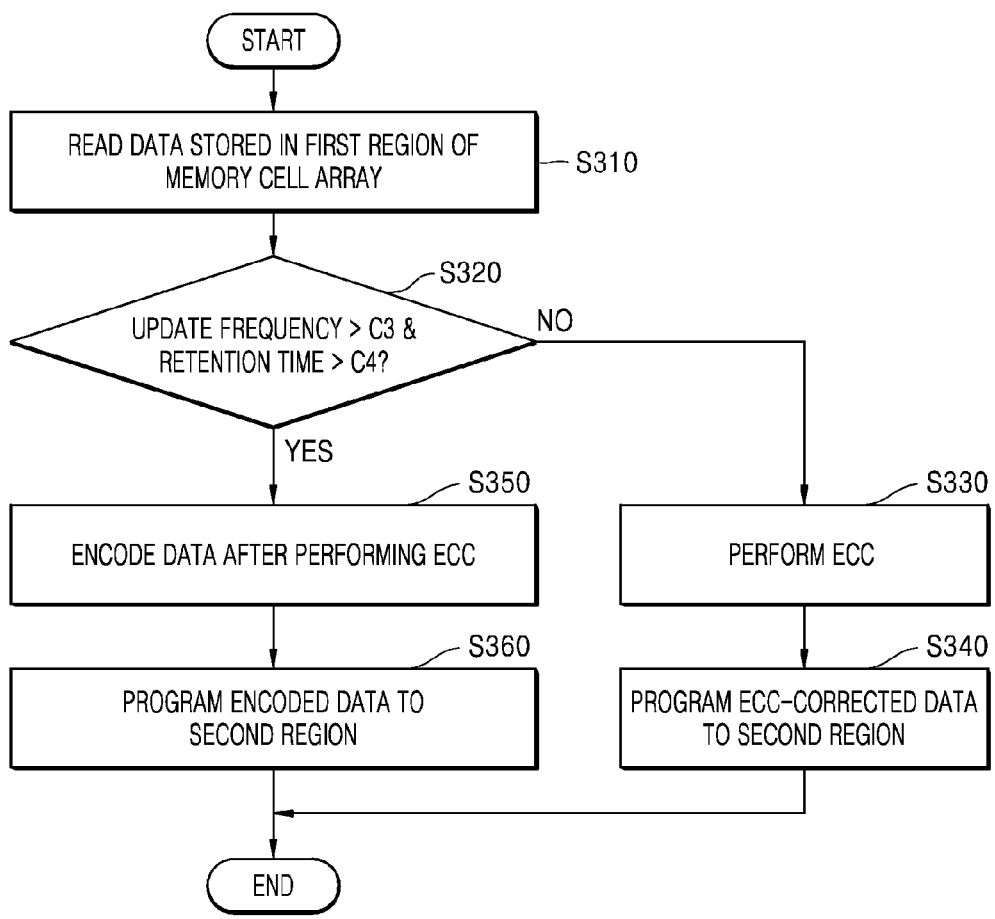
FIG. 12 is a flowchart of a method of operating a memory system according to an exemplary embodiment of the disclosure.

FIG. 12 is a flowchart of a method of operating a memory system according to an exemplary embodiment of the disclosure. The method of operating a memory system of FIG. 12 is a method of performing a garbage collection process, and details described with reference to FIG. 9 may also apply to the method of operating a memory system of the present exemplary embodiment.

Referring to FIG. 12, the memory controller 200 reads data stored in a first region of the memory cell array 110 in operation 5310. The memory controller 200 may determine whether an encoding condition is satisfied, based on the read data, in operation 5320. For example, the memory controller 200 may determine whether an encoding condition is satisfied, based on an update frequency and a retention time of the read data. If an update frequency exceeds a predetermined third reference value C3, and a retention time exceeds a predetermined fourth reference value C4, the memory controller 200 may determine that an encoding condition is satisfied. Otherwise, the memory controller 200 may determine that an encoding condition is not satisfied.

If an encoding condition is not satisfied, the memory controller 200 may perform ECC on the read data in operation 5330, and may program the ECC-corrected data to a second region in operation 5340.

When an encoding condition is satisfied, the memory controller 200 may perform ECC on the read data and encode the ECC-corrected data in operation 5350. Next, the memory controller 200 may program encoded data to the second region in operation S360. Accordingly, a garbage collection process may be performed on the data stored in the first region.

Figure 13:
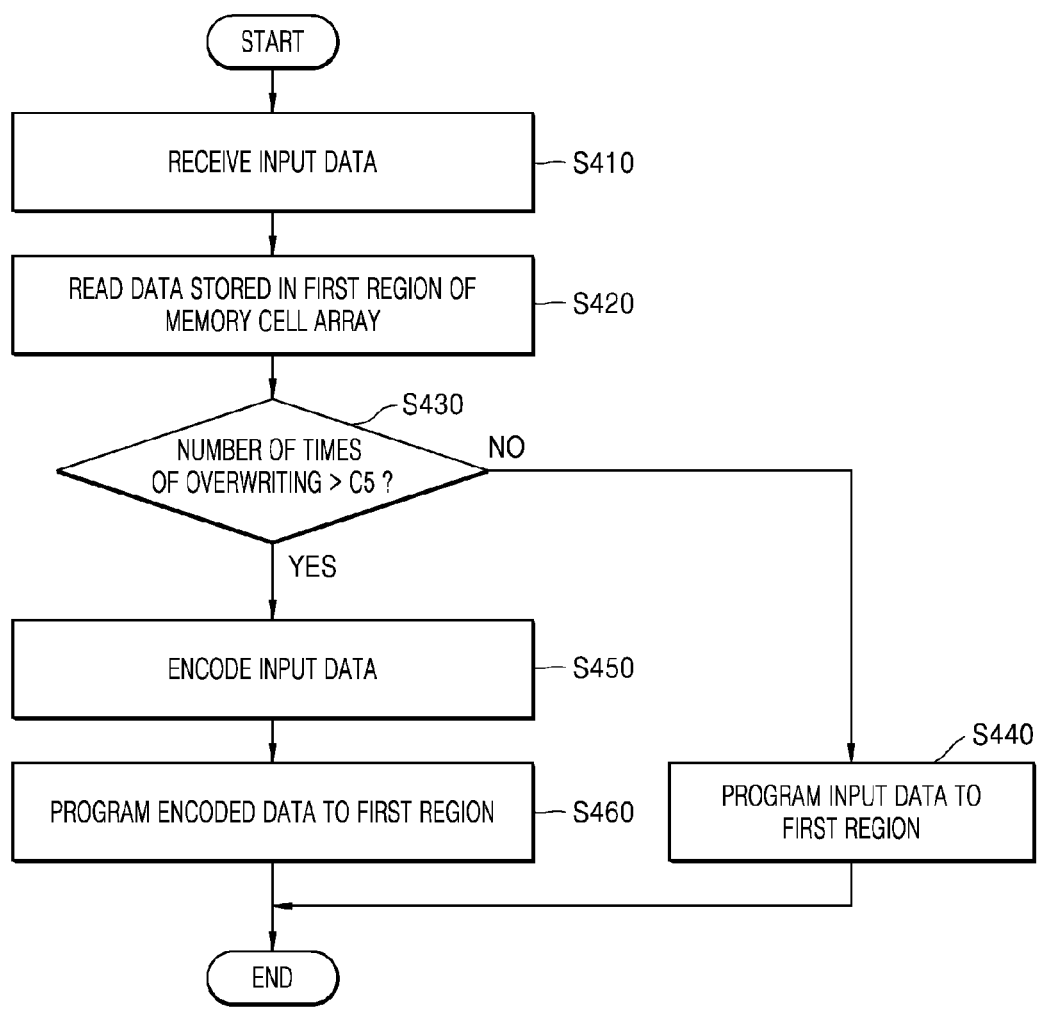
FIG. 13 is a flowchart of a method of operating a memory system according to an exemplary embodiment of the disclosure.

FIG. 13 is a flowchart of a method of operating a memory system according to an exemplary embodiment of the disclosure. The method of operating a memory system of FIG. 13 is a method of performing a data comparison write operation, and details described with reference to FIG. 9 may also apply to the method of operating a memory system of the present exemplary embodiment.

Unlike a flash memory, a resistive memory such as a ReRAM is overwritable. Here, a write operation such as a set write operation or a reset write operation may be performed only when it is determined that data is changed based on pre-reading data stored in a memory cell and comparing the pre-read data with data to be stored in a memory cell. The above write method may be referred to as a data comparison write operation.

Referring to FIG. 13, the memory controller 200 may receive input data in operation S410. However, the exemplary embodiments of the disclosure are not limited thereto. Input data may also be generated in the memory controller 200. For example, updatable data such as metadata may be input data on which a data comparison write operation is performed.

The memory controller 200 reads data stored in a first region of the memory cell array 110 in operation S420.

In operation S420, the memory controller 200 may determine whether an encoding condition is satisfied. For example, the memory controller 200 may determine whether an encoding condition is satisfied, based on the number of times the first region is overwritten. For example, the memory controller 200 may determine that an encoding condition is satisfied, if the number of times the first region is overwritten exceeds a predetermined fifth reference value C5. Alternatively, the memory controller 200 may determine whether an encoding condition is satisfied, based on the number of times of erasing, and if the number of times the first region is erased is equal to or less than a predetermined reference value, the memory controller 200 may determine that an encoding condition is satisfied.

If an encoding condition is not satisfied, the memory controller 200 may provide the memory device 100 (FIG. 1) with input data to thereby program the input data to the first region in operation S440. The memory device 100 may compare input data with read data and program memory cells whose data is changed.

When an encoding condition is satisfied, the memory controller 200 may encode input data in operation 5450, and may program the encoded data to the first region in operation 5460. The memory controller 200 may provide the memory device 100 with the encoded data, and the memory device 100 may compare the encoded data with the read data and program memory cells whose data is changed.

Figure 14:
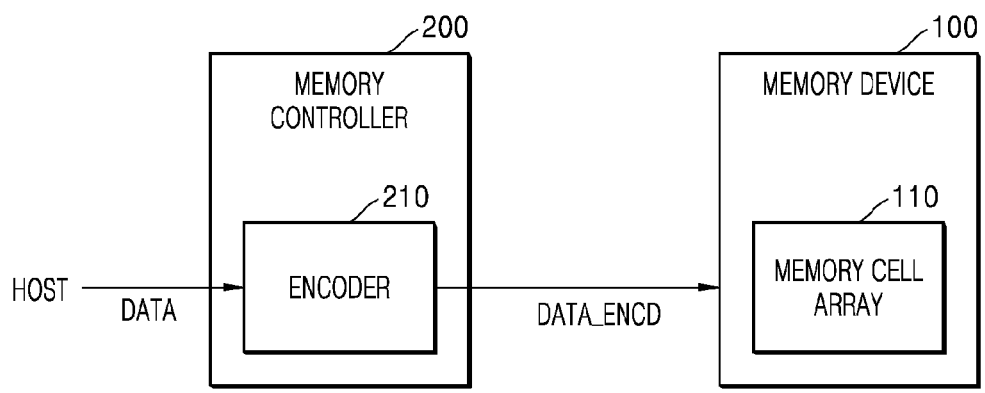
FIG. 14 is a block diagram illustrating a method of operating a memory system according to an exemplary embodiment of the disclosure.

FIG. 14 is a block diagram illustrating a method of operating a memory system 10 according to an exemplary embodiment of the disclosure. The memory controller 200 receives input data DATA from a host HOST, and the encoder 210 may encode the received input data DATA. The memory controller 200 may provide the memory device 100 with encoded data DATA_ENCD. The encoded data DATA_ENCD may be programmed to the memory cell array 110.

Figure 15:
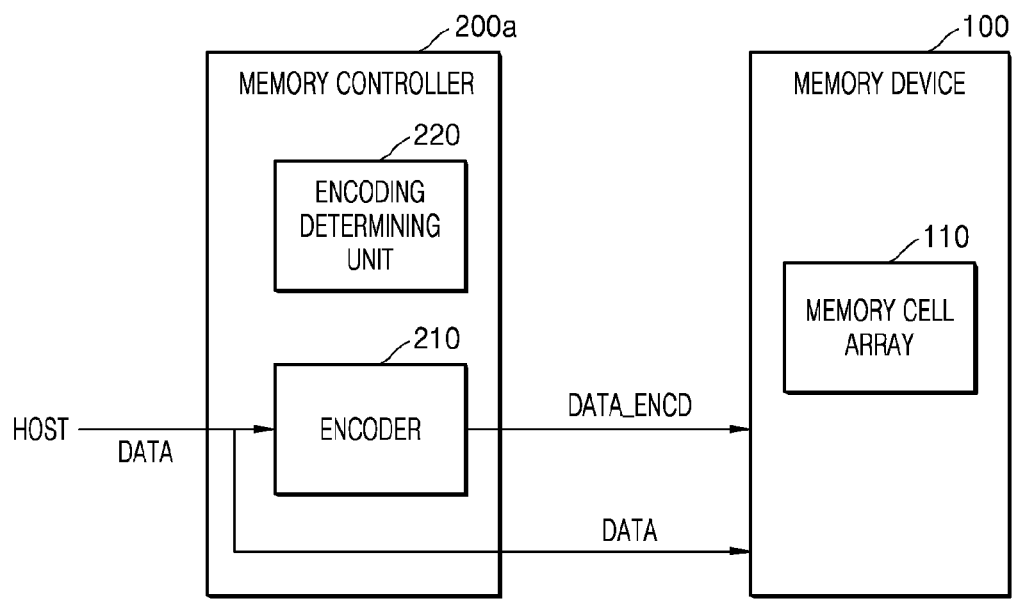
FIG. 15 is a block diagram illustrating a method of operating a memory system according to an exemplary embodiment of the disclosure.

FIG. 15 is a block diagram illustrating a method of operating a memory system 10a according to an exemplary embodiment of the disclosure.

According to the present exemplary embodiment, the memory controller 200a may receive input data DATA from the host HOST, and may determine whether to perform encoding on the input data DATA. To this end, the memory controller 200a may include an encoding determining unit 220. In an exemplary embodiment, the encoding determining unit 220 may determine whether to perform encoding based on data characteristics of the input data DATA or the like. For example, if input data is highly likely to be stored in the memory cell array 110 for a predetermined period of time, if input data requires reliability, if input data is data that is not frequently updated, or if input data is frequently updated but is updated at the same physical location in the memory cell array 110, the encoding determining unit 220 may determine to perform encoding. In another exemplary embodiment, the encoding determining unit 220 may predict a degree of deterioration of a memory cell of a region, in which the input data is to be stored, and determines whether to encode the input data based on the predicted degree of deterioration of the memory cell. According to another exemplary embodiment, the memory controller 200a may encode input data DATA according to a request from the host HOST.

When the memory controller 200a determines to perform encoding on input data DATA, the input data DATA may be provided to the encoder 210. The encoder 210 may encode the input data DATA. Encoded data DATA_ENCD may be provided to the memory device 100.

When the memory controller 200a determines not to perform encoding on the input data DATA, the input data DATA may be provided to the memory device 100 without performing encoding. The memory device 100 stores either the encoded data DATA_ENCD or data DATA in the memory cell array 110.

Figure 16:
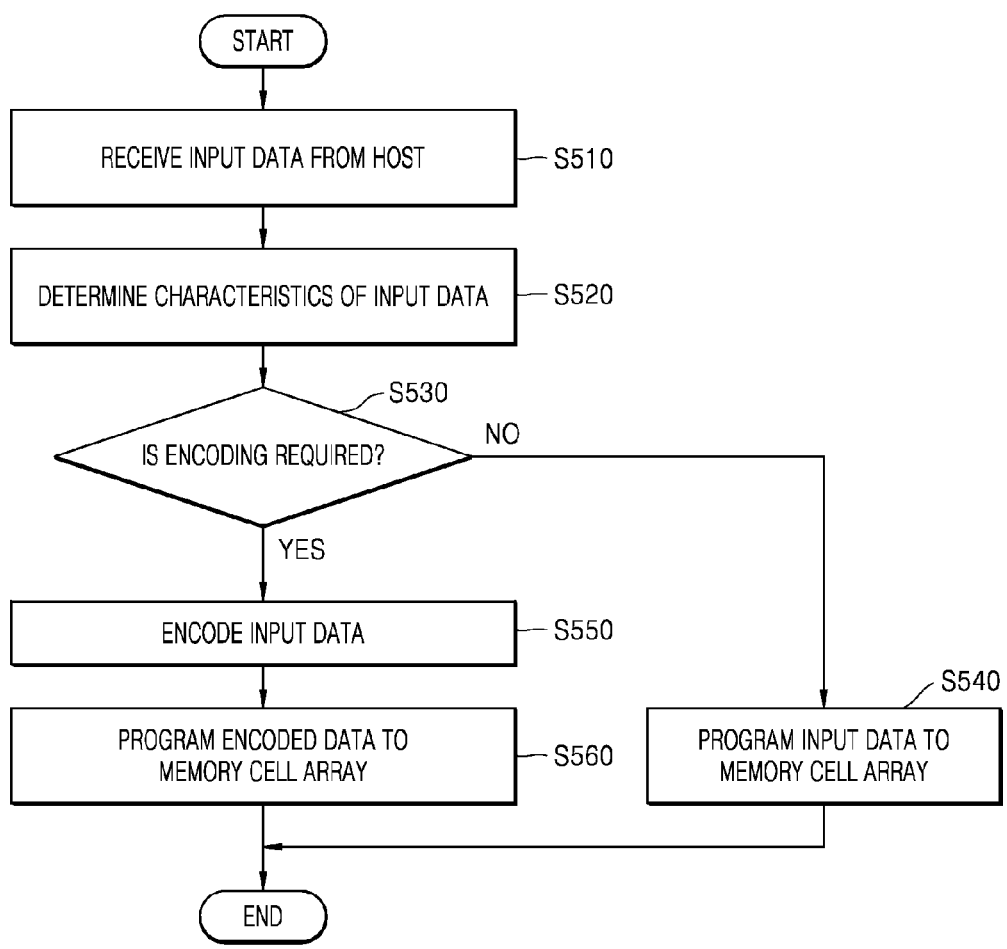
FIG. 16 is a flowchart of a method of operating a memory system according to an exemplary embodiment of the disclosure.

FIG. 16 is a flowchart of a method of operating a memory system according to an exemplary embodiment of the disclosure. Details described with reference to FIG. 15 may also apply to the method of operating a memory system of the present exemplary embodiment.

Referring to FIG. 16, the memory controller 200 may receive input data from a host in operation S510. The memory controller 200 may determine data characteristics of the input data in operation S520. For example, the memory controller 200 may determine whether the input data requires high reliability or is frequently updated. According to an exemplary embodiment, the memory controller 200 may receive the input data and characteristics information about the input data together from a host, and may determine data characteristics of the input data based on the characteristics information.

The memory controller 200 may determine whether encoding on the input data is required based on data characteristics of the input data in operation S530. For example, if input data requires reliability, or if input data is not frequently updated and is to be stored in a memory cell array for a predetermined period of time, the memory controller 200 may determine that encoding is required.

If encoding is not required, the memory controller 200 may provide the memory device 100 with the input data to thereby program the input data to the memory cell array in operation S540.

If encoding is required, the memory controller 200 may encode input data in operation S550. Input data may be encoded such that at least one of the number of memory cells in a first programming state P1 and the number of memory cells in a second programming state P2 is smaller than at least one of the numbers of memory cells in other states.

The memory controller 200 may provide the memory device 100 with encoded data to thereby program the encoded data to the memory cell array in operation S560.

Figure 17:
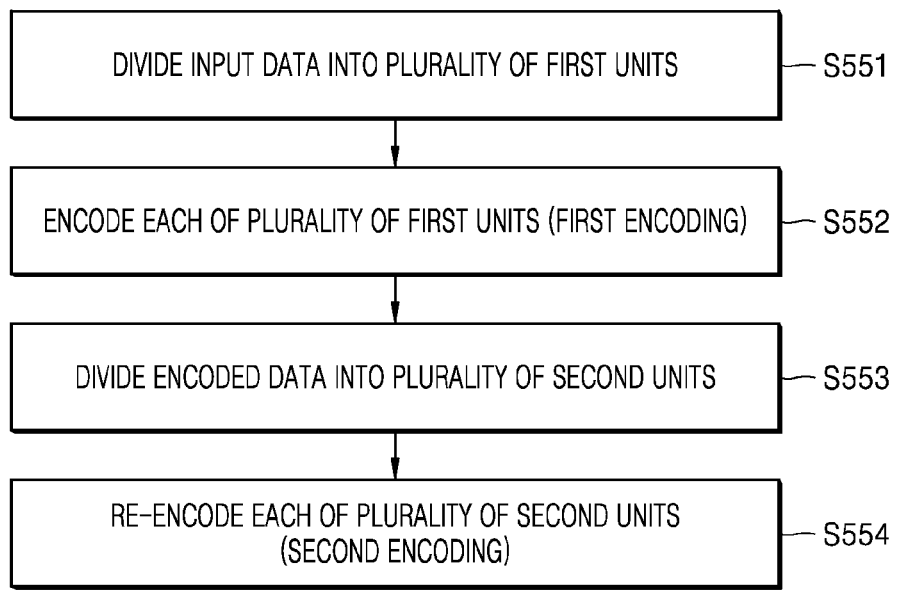
FIG. 17 is a flowchart of a method of performing double encoding.

Meanwhile, as illustrated in FIG. 17 with respect to the input data in the performing of encoding in operation S550, double encoding may be performed. FIG. 17 is a flowchart of a method of performing double encoding.

Referring to FIG. 17, the encoder 210 may divide input data into a plurality of first units in operation S551. For example, the first unit may be a minimum write unit, based on which writing is performed on a memory cell array.

The encoder 210 may encode each of the plurality of first units in operation S552. This may be referred to as first encoding.

The encoder 210 may divide the encoded data into a plurality of second units in operation S553. The second unit is larger than the first unit. For example, the second unit may be a larger unit than a write unit.

The encoder 210 may re-encode each of the plurality of second units in operation S554. This may be referred to as second encoding.

For example, if the amount of input data to be written is four times the amount of data that may be written to a write unit, the encoder 21 may divide the input data to four write units, and perform first encoding on each of the four write units. After performing the first encoding, the encoder 210 may divide and write the encoded data to other units, for example, to two units which are each twice the size of the write unit, and may perform second encoding on the each of the two units. As described above, the encoder 210 may perform double encoding based on different units.

Figure 18:
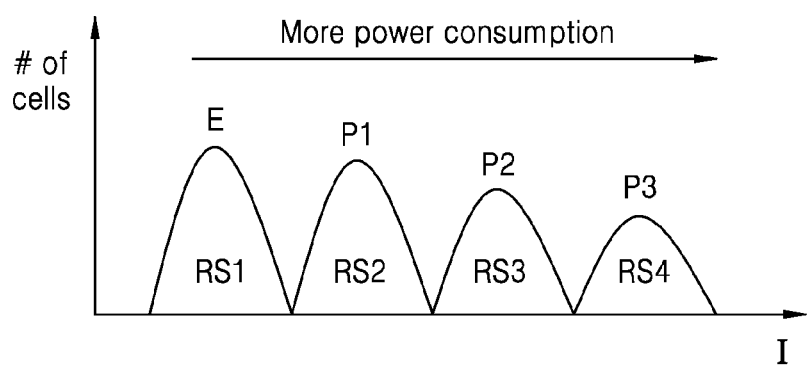
FIG. 18 is a graph showing a resistance distribution of memory cells for to an encoding method according to an exemplary embodiment of the disclosure.

FIG. 18 is a graph showing a resistance distribution of memory cells according to an encoding method according to an exemplary embodiment of the disclosure. Referring to FIG. 18, the encoder 210 (see FIG. 1) may encode input data such that the number of memory cells in the first programming state P1 or the second programming state P2, that is, the second resistance state RS2 or the third resistance state RS3, is smaller than the number of memory cells in the erase state E, that is, the first resistance state RS1. Also, the encoder 210 may encode input data such that the number of memory cells in a resistance state is reduced as the resistance state is reduced. As illustrated in FIG. 18, the encoder 210 may encode input data such that the number of memory cells in the second resistance state RS2 is smaller than the number of memory cells in the first resistance state RS1, that the number of memory cells in the third resistance state RS3 is smaller than the number of memory cells in the second resistance state RS2, and that the number of memory cells in the fourth resistance state RS4 is smaller than the number of memory cells in the third resistance state RS3. In a resistive memory device, as a memory cell is programmed to be in a lower resistance state, power consumption may be increased. According to the disclosure, data reliability may be improved and power consumption may be reduced as the memory system performs encoding such that at least one of the number of memory cells in the second resistance state RS2 and the number of memory cells in the third resistance state RS3 is reduced, and that the number of memory cells in a resistance state is reduced as the resistance state is reduced.

Figure 19:
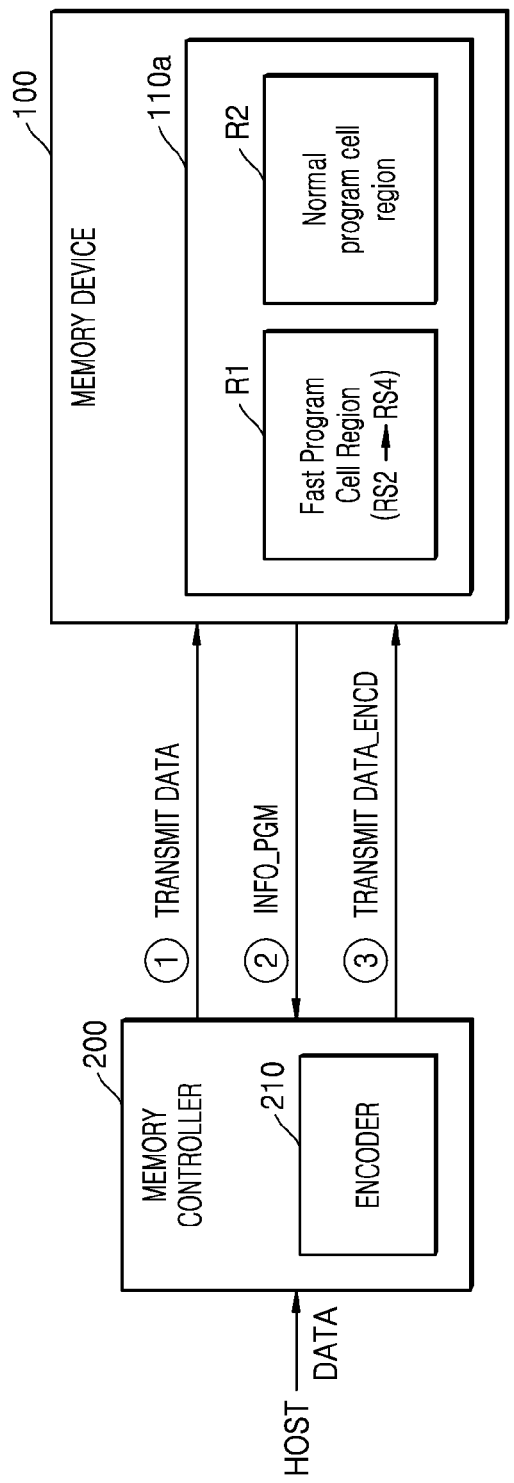
FIG. 19 is a block diagram illustrating a method of operating a memory system according to an exemplary embodiment of the disclosure.

FIG. 19 is a block diagram illustrating a method of operating a memory system according to an exemplary embodiment of the disclosure. According to the present exemplary embodiment, the memory controller 200 receives input data DATA from a host HOST, and may program the input data DATA to a memory cell array 110a. More specifically, the memory controller 200 transmits the data as TRANSMIT DATA to the memory device 100 for storage in memory cell array 110a. The memory cell array 110a may include a fast programming cell region R1 and a normal programming cell region R2. Memory cells of the fast programming cell region R1 may be memory cells to which a set write operation is performed at a high speed. However, a reset write operation may be performed using programming as the memory cells are overprogrammed in a resistance state lower than a target resistance state. This may increase programming time. According to an exemplary embodiment of the disclosure, the memory controller 200 may receive program information INFO_PGM from the memory device 100, and if either the first programming state P1 or the second programming state P2, that is, either the second resistance state RS2 or the third resistance state RS3 is allocated to memory cells of the fast programming cell region R1, the memory controller 200 may perform encoding with the encoder 210, whereby the second resistance state RS2 or the third resistance state RS3 is changed to a lowest resistance state, that is, to the fourth resistance state RS4 for a 2-bit multi-level memory cell and to an eighth resistance state RS8 for a 3-bit triple-level memory cell. Alternatively, the memory controller 200 may perform encoding with the encoder 210, whereby the second resistance state RS2 or the third resistance state RS3 is changed to a resistance state lower than the above resistance states. Also, the memory controller 200 may transmit encoded data DATA_ENCD to a memory device so that the encoded data DATA_ENCD is programmed to the fast programming cell region R1. Accordingly, when performing programming, a reset frequency and a programming time may be reduced.

Figure 20:
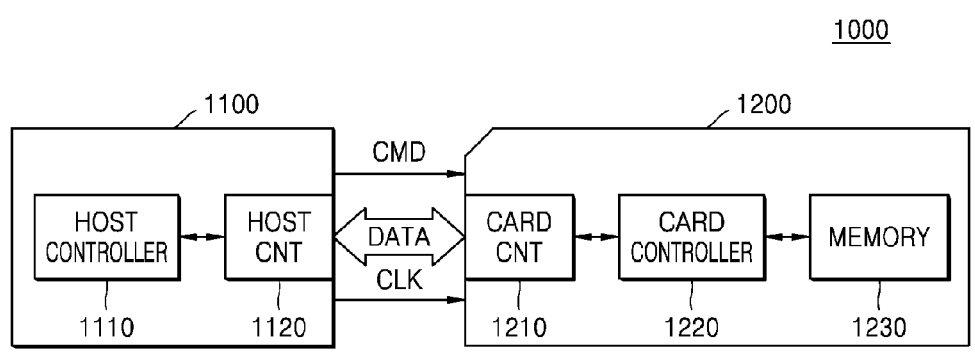
FIG. 20 is a block diagram of a memory system, according to exemplary embodiments of the disclosure, applied to a memory card system.

FIG. 20 is a block diagram of a memory system according to exemplary embodiments of the disclosure, applied to a memory card system 1000.

Referring to FIG. 20, the memory card system 1000 may include a host 1100 and a memory card 1200. The host 1100 may include a host controller 1110 and a host connector 1120. The memory card 1200 may include a card connector 1210, a card controller 1220, and a memory device 1230. Here, the memory card 1200 may be embodied by using the exemplary embodiments shown in FIGS. 1 through 19.

The host 1100 may write data to the memory 1200 or may read data stored in the memory card 1200. The host controller 1110 may transmit a command CMD, a clock signal CLK generated by a clock generator (not shown) in the host 1100, and data DATA to the memory card 1200 via the host connector 1120.

In response to the command CMD received via the card connector 1210, the card controller 1220 may store the data DATA in the memory device 1230, in synchronization with a clock signal that is generated by a clock generator (not shown) in the card controller 1220. The memory device 1230 may store the data DATA that is transmitted from the host 1100.

The memory card 1200 may be embodied as a compact flash card (CFC), a Microdrive, a Smart Media Card (SMC), a Multimedia Card (MMC), a Security Digital Card (SDC), a memory stick, or a USB flash memory drive.

Figure 21:
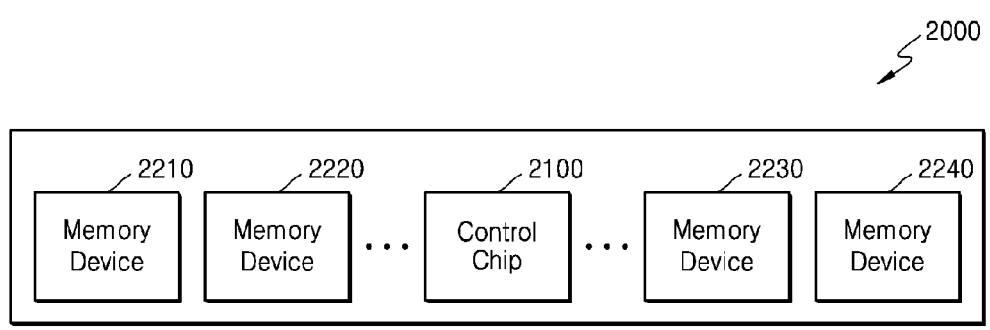
FIG. 21 illustrates a resistive memory module according to exemplary embodiments of the disclosure.

FIG. 21 illustrates a resistive memory module according to exemplary embodiments of the disclosure. Referring to FIG. 21, the resistive memory module 2000 may include memory devices 2210 through 2240 and a control chip 2100. Each of the memory devices 2210 through 2240 may be embodied by using the exemplary embodiments shown in FIGS. 1 through 18.

In response to various signals transmitted by an external memory controller, the control chip 2100 may control the memory devices 2210 to 2240. For example, according to various commands and addresses that are transmitted from an external source, the control chip 2100 may activate the memory devices 2210 to 2240 corresponding to the various commands and addresses and thus may control write and read operations. Also, the control chip 2100 may perform various post processing operations on read data output from each of the memory devices 2210 to 2240, e.g., the control chip 2100 may perform error detection and correction operations on the read data. Also, the control chip 2100 may control the memory devices 2210 to 2240 so as to adjust the number of inhibit voltages generated by each of the memory devices 2210 to 2240 or the voltage difference between the inhibit voltages.

Figure 22:
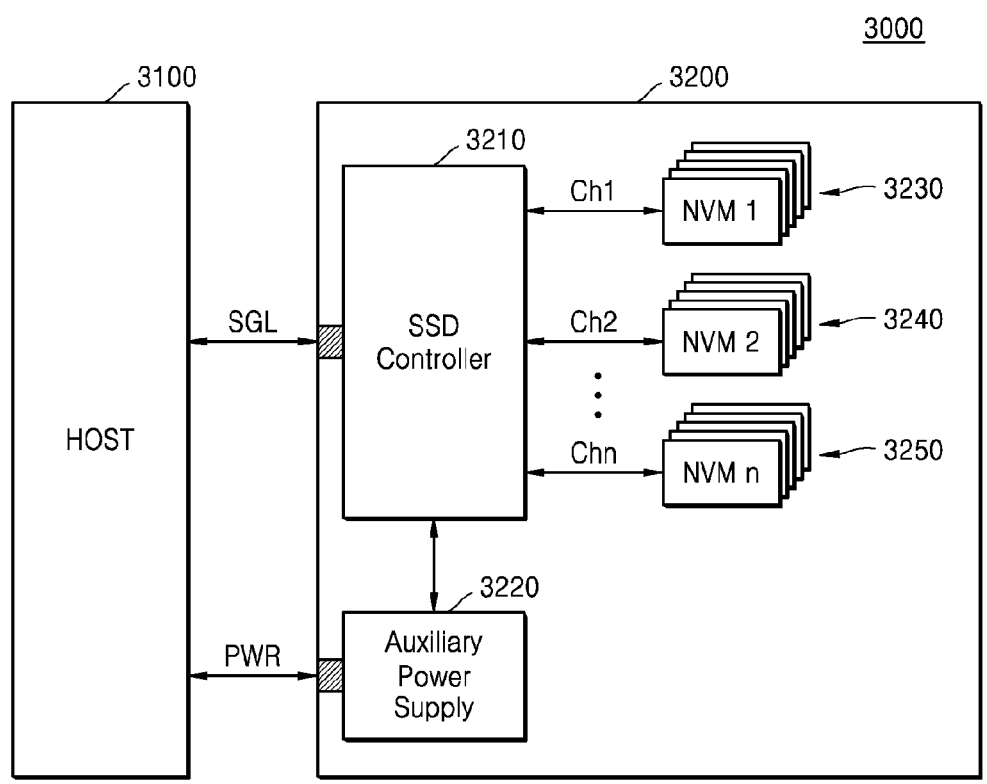
FIG. 22 is a block diagram of a solid state disk (SSD) system including a memory system applied thereto, according to an exemplary embodiment of the disclosure.

FIG. 22 is a block diagram of a solid state disk (SSD) system 3000 including a memory system applied thereto, according to an exemplary embodiment of the disclosure.

Referring to FIG. 22, the SSD system 3000 may include a host 3100 and an SSD 3200. The SSD 3200 exchanges signals SGL with the host 3100 via a signal connector, and may receive a power input PWR from a power connector. The SSD 3200 includes an SSD controller 3210, an auxiliary power device 3220, and a plurality of non-volatile memory devices 3230, 3240, and 3250. Here, the SSD 3200 may be embodied by using the exemplary embodiments of FIGS. 1 through 19. The SSD controller 3210 communicates with the plurality of non-volatile memory devices NVM 1 3230, NVM 2 3240, and NVM n 3250 through channels Ch1, Ch2, . . . Chn, respectively.

Figure 23:
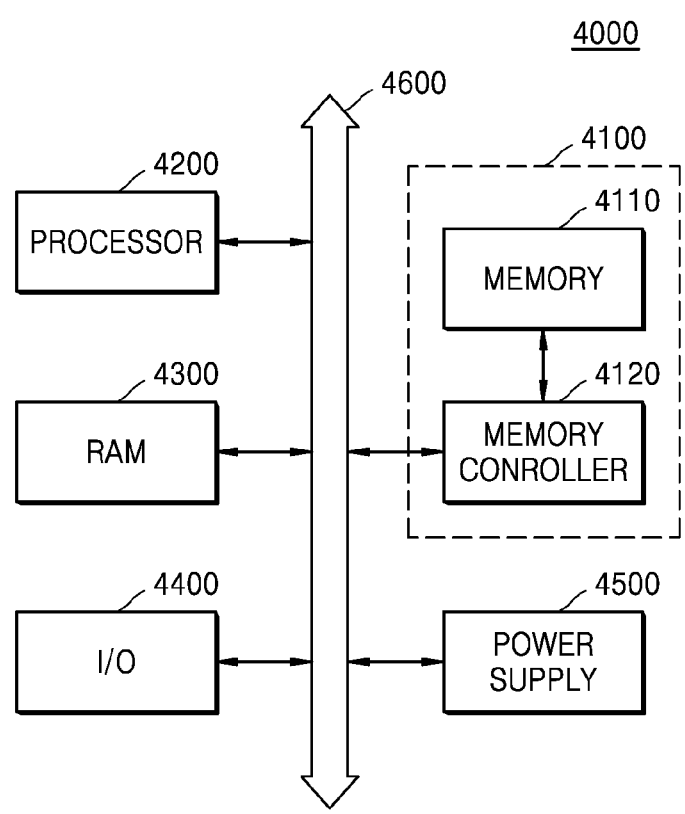
FIG. 23 is a block diagram of a computing system including the memory system according to the exemplary embodiments of the disclosure.

FIG. 23 is a block diagram of a computing system 4000 including a memory system according to an exemplary embodiment of the disclosure.

Referring to FIG. 23, the computing system 4000 may include a memory system 4100, a processor 4200, a RAM 4300, an input/output (I/O) device 4400, and a power supply device 4500. Although not illustrated in FIG. 23, the computing system 4000 may further include ports capable of communicating with a video card, a sound card, a memory card, or a USB device, or other electronic devices. The computing system 4000 may be embodied as a PC, or a portable electronic device such as a notebook computer, a mobile phone, a personal digital assistant (PDA), or a camera.

The processor 4200 may perform particular calculations or tasks. In one or more exemplary embodiments, the processor 4200 may be a micro-processor or a Central Processing Unit (CPU). The processor 4200 may perform communication with the RAM 4300, the I/O device 4400, and the memory system 4100 via a bus 4600 such as an address bus, a control bus, or a data bus. Here, the memory system 4100 may include a memory 4110 and a memory controller 4120 and be embodied by using the exemplary embodiments shown in FIGS. 1 through 19.

In one or more exemplary embodiments, the processor 4200 may also be connected to an extended bus such as a Peripheral Component Interconnect (PCI) bus.

The RAM 4300 may store data for operations of the computing system 4000. As described above, the memory device according to the one or more exemplary embodiments of the disclosure may be applied to the RAM 4300. Alternatively, a DRAM, a mobile DRAM, an SRAM, a PRAM, an FRAM, or an MRAM may be used as the RAM 4300.

The I/O device 4400 may include an input unit such as a keyboard, a keypad, or a mouse, and an output unit such as a printer or a display. The power supply device 4500 may supply an operating voltage for the operations of the computing system 4000.

While the disclosure has been particularly shown and described with reference to exemplary embodiments thereof, it will be understood that various changes in form and details may be made therein without departing from the spirit and scope of the following claims.

What is claimed is:

1. A resistive memory system comprising:
   a memory device including a resistive memory cell array; and
   a controller generating write data to be written to the memory cell array by encoding input data such that the input data corresponds to an erase state and a plurality of programming states of a memory cell, wherein:
   the input data is encoded such that at least one of the number of memory cells assigned a first programming state and the number of memory cells assigned a second programming state is smaller than at least one of the number of memory cells in the erase state and the number of memory cells in other programming states,
   a resistance level of the first programming state is highest among resistance levels of the plurality of programming states, and a resistance level of the second programming state is second highest among the resistance levels of the plurality of programming states, and
   the controller performs the encoding in response to the controller determining that the input data is to be stored in the memory cell for a preset first reference period of time or longer.

2. The resistive memory system of claim 1, wherein the controller encodes the input data such that, with respect to the write data, the number of memory cells in the first programming state or the number of memory cells in the second programming state is the least from among the numbers of memory cells in the erase state and the other programming states.

3. The resistive memory system of claim 1, wherein the controller reads data stored in a region of the memory cell array in which the input data is to be stored, and encodes the input data such that the number of pieces of first data corresponding to the first programming state of the write data or the number of pieces of second data corresponding to the second programming state of the write data is reduced to be smaller than the number of pieces of first data or the number of pieces of second data of the read data.

4. The resistive memory system of claim 1, wherein the controller determines cell deterioration of a first region of the memory cell array in which the input data is to be stored and determines whether to encode the input data based on a result of the determining.

5. The resistive memory system of claim 4, wherein the controller reads data stored in the first region and determines the cell deterioration of the first region based on at least one of the number of errors included in the read data, update frequency of the read data, retention time of the read data, and number of times the first region is erased or overwritten.

6. The resistive memory system of claim 1, wherein the controller performs the encoding in response to a request from a host.

7. The resistive memory system of claim 1, wherein the controller determines data characteristics of the input data or receives the data characteristics of the input data, and determines whether to encode the input data based on the data characteristics.

8. The resistive memory system of claim 7, wherein the controller performs the encoding when reliability of a predetermined reference level or higher is required for the input data.

9. The resistive memory system of claim 1, wherein when a memory cell, in which the input data is to be stored and which is to be programmed at a highest speed compared to other memory cells of the memory cell array, is set to at least one of the first programming state and the second programming state, the controller encodes the input data such that the memory cell is set to a state having a lower resistance level than a resistance level of the set state of the memory cell.

10. The resistive memory system of claim 1 wherein:
    the controller divides the input data into first units, performs a first encoding operation on data written to each first unit, divides the data encoded by the first encoding operation into second units, and performs a second encoding operation on data written to each second unit,
    each of the first units is a write unit and each of the second units is larger than each of the first units.

11. The resistive memory system of claim 1, wherein the controller stores the generated write data and a parity bit about the generated write data on different pages, different word lines, different programming units, different tiles, or different blocks of the memory cell array.

12. A resistive memory system comprising:
    a memory cell array including a plurality of resistive memory cells;
    an encoder for generating write data to be programmed to a memory cell array to at least one of a plurality of states by encoding input data such that at least one of the number of memory cells to be programmed to a first state and the number of memory cells to be programmed to a second state is reduced; and
    an encoding determining unit that predicts a degree of deterioration of a memory cell of a region, in which the input data is to be stored, and determines whether to encode the input data based on the predicted degree of deterioration of the memory cell, wherein
    a resistance level of the first state is second highest among resistance levels of the plurality of states, and a resistance level of the second state is third highest among the resistance levels of the plurality of states.

13. The resistive memory system of claim 12, wherein the encoder encodes the input data such that at least one of the number of memory cells to be programmed to the first state and the number of memory cells to be programmed to the second state is less than the number of memory cells to be programmed to a state having a highest resistance from among the plurality of states.

14. A memory controller comprising:
    a processor that determines whether data is to be encoded prior to being programmed into memory cells of a nonvolatile memory, wherein each of the memory cells is assigned one of a plurality of un-encoded information states, respectively corresponding to programmable resistance levels of the memory cells, for representing the data; and an encoder that encodes the data, for an affirmative determination by the processor, such that:

one of a plurality of encoded information states, respectively corresponding to the programmable resistance levels, is assigned to each of the memory cells, and the number of memory cells to which a predetermined first encoded information state, among the encoded information states, has been assigned is always reduced with respect to the number of memory cells to which a predetermined Nth un-encoded information state, among the un-encoded information states, has been assigned, wherein:

the encoder divides the data into first units, performs a first encoding operation on data written to each first unit, divides encoded data encoded by the first encoding operation into second units, and performs a second encoding operation on data written to each second unit, and each of the first units is a write unit and each of the second units is larger than each of the first units.

15. The memory controller of claim 14, wherein the Nth un-encoded information state and the first encoded information state correspond to the same programmable resistance level, among the programmable resistance levels.

16. The memory controller of claim 15, wherein the same programmable resistance level is a first programmable resistance level that is neither the programmable resistance level, among the programmable resistance levels, having the least or most resistance.

17. The memory controller of claim 14, wherein the Nth un-encoded information state and the first encoded information state correspond to different programmable resistance levels, among the programmable resistance levels.

18. The memory controller of claim 14, wherein:

the encoder further encodes the data, for the affirmative determination by the processor, such that the number of memory cells to which a predetermined second encoded information state, among the encoded information states, has been assigned is always reduced with respect to the number of memory cells to which a predetermined Mth un-encoded information state, among the un-encoded information states, has been assigned, and the first encoded information state corresponds to a different programmable resistance level than that corresponding to the second encoded information state.

* * * * *